US012780624B2

(12) United States Patent
Lunsman et al.

(10) Patent No.: US 12,780,624 B2
(45) Date of Patent: Nov. 3, 2026

(54) LIFT DEVICE

(71) Applicant: HEWLETT PACKARD ENTERPRISE DEVELOPMENT LP, Spring, TX (US)

(72) Inventors: Harvey John Lunsman, Chippewa Falls, WI (US); Perry Dennis Franz, Elk Mound, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 495 days.

(21) Appl. No.: 18/491,026

(22) Filed: Oct. 20, 2023

(65) Prior Publication Data

US 2025/0128923 A1 Apr. 24, 2025

(51) Int. Cl.
*B66F 3/44* (2006.01)
*H05K 7/14* (2006.01)

(52) U.S. Cl.
CPC ............. *B66F 3/44* (2013.01); *H05K 7/1488* (2013.01); *H05K 7/1485* (2013.01)

(58) Field of Classification Search
CPC .. H05K 7/1488; H05K 7/1485; H05K 7/1489; B66F 3/44; B66B 9/022
See application file for complete search history.

(56) References Cited

U.S. PATENT DOCUMENTS 3,945,510 A * 3/1976 Saul, Jr. ............... B65G 1/0407 211/162
4,265,583 A * 5/1981 Baird ........................ B66F 9/12 414/284
4,269,285 A * 5/1981 Ohkoshi .................. H02B 3/00 187/244
6,065,821 A * 5/2000 Anderson .............. A47B 57/06 248/292.12
6,524,052 B1 * 2/2003 Yamauchi ............ H05K 13/021 414/811
7,090,457 B2 * 8/2006 Martin .................. B62B 5/0083 187/241
7,281,607 B1 * 10/2007 Kiraly ....................... E06C 7/12 182/102

(Continued)

FOREIGN PATENT DOCUMENTS

CN 217217125 U * 8/2022
CN 218998542 U * 5/2023

(Continued)

*Primary Examiner* — Minh Truong
*Assistant Examiner* — Michelle M Mudwilder
(74) *Attorney, Agent, or Firm* — Jones Burke, PLLC

(57) ABSTRACT

A lift device including a body, a drive unit, an actuator, one or more output gears, and one or more bearing structures. The lift device has an attached state and a detached state. In the attached state, the lift device is removably attached to and may translate vertically along one or more vertical columns having a first side including a linear gear and a second side opposite the first side. The one or more vertical columns support the lift device via the one or more output gears engaging the linear gear, to drive vertical translation, and the one or more bearing structures movably bearing against the second side. The one or more vertical columns are integral with, or removably attached to, a chassis. In the detached state, the lift device is detached from the one or more vertical columns and freely maneuverable.

19 Claims, 9 Drawing Sheets

(56) References Cited

U.S. PATENT DOCUMENTS

| | | | | |
|---|---|---|---|---|
| 8,951,000 | B2 * | 2/2015 | McIntosh | H05K 7/18<br>211/209 |
| 9,108,828 | B2 | 8/2015 | Bolde | |
| 9,376,290 | B2 | 6/2016 | Mcintosh et al. | |
| 9,796,395 | B2 * | 10/2017 | Tasaka | B61B 15/00 |
| 11,806,582 | B1 * | 11/2023 | Brown | A01M 31/02 |
| 2003/0221914 | A1 | 12/2003 | Smith et al. | |
| 2008/0056867 | A1 | 3/2008 | Zuckerman | |
| 2008/0131241 | A1 * | 6/2008 | King | G11B 15/68<br>414/274 |
| 2009/0129905 | A1 | 5/2009 | Mcintosh et al. | |
| 2023/0303370 | A1 * | 9/2023 | Ozuna | H05K 7/1488 |

FOREIGN PATENT DOCUMENTS

| | | | | | |
|---|---|---|---|---|---|
| CN | 116462132 | A | * | 7/2023 | B66F 9/07504 |
| WO | WO-02059020 | A1 | * | 8/2002 | B65G 1/0407 |
| WO | WO-2025077145 | A1 | * | 4/2025 | H05K 7/1488 |

* cited by examiner

5

LIFT DEVICE

INTRODUCTION

Many information processing devices, particularly information processing devices such as servers and networking devices, are housed in racks, cabinets, system housings, or other similar structures which are designed to hold multiple information processing devices, often in a vertically stacked arrangement. A rack may comprise a frame with mounting features (e.g., holes) to which the information processing devices can be attached. A cabinet may comprise a rack to which walls, doors, and/or other structures have been added to form an enclosure. A system housing may form an enclosure for an integrated system (such as a blade server, high-performance-compute system, etc.), and may comprise bays to removably receive individual information processing devices of the system and a backplane to interconnect and provide power to the information processing devices. Herein, racks, cabinets, system housings, or any other similar structures for housing multiple information processing devices are referred to herein generically as a "chassis".

Information processing devices can be relatively heavy, and thus when information processing devices need to be installed in or removed from a multi-device chassis (e.g., for service, removal, or new installation), auxiliary tools such as mechanical lifts are typically required to assist technicians in extracting and installing the information processing devices. Traditional mechanical lifts typically have a large footprint and a large weight to increase stability which aids in extracting or inserting heavy information processing devices at various heights within chassis. While the large footprint and large weight of traditional mechanical lifts provides stability, those same features also make traditional mechanical lifts difficult to maneuver and transport.

BRIEF DESCRIPTION OF THE DRAWINGS

The present disclosure can be understood from the following detailed description, either alone or together with the accompanying drawings. The drawings and related description of the figures are included to provide a further understanding of the present disclosure and are incorporated in and constitute a part of this specification. The drawings illustrate one or more nonlimiting aspects and implementations of the present teachings and together with the description explain certain principles and operation. In the drawings.

DETAILED DESCRIPTION

Figure 1:
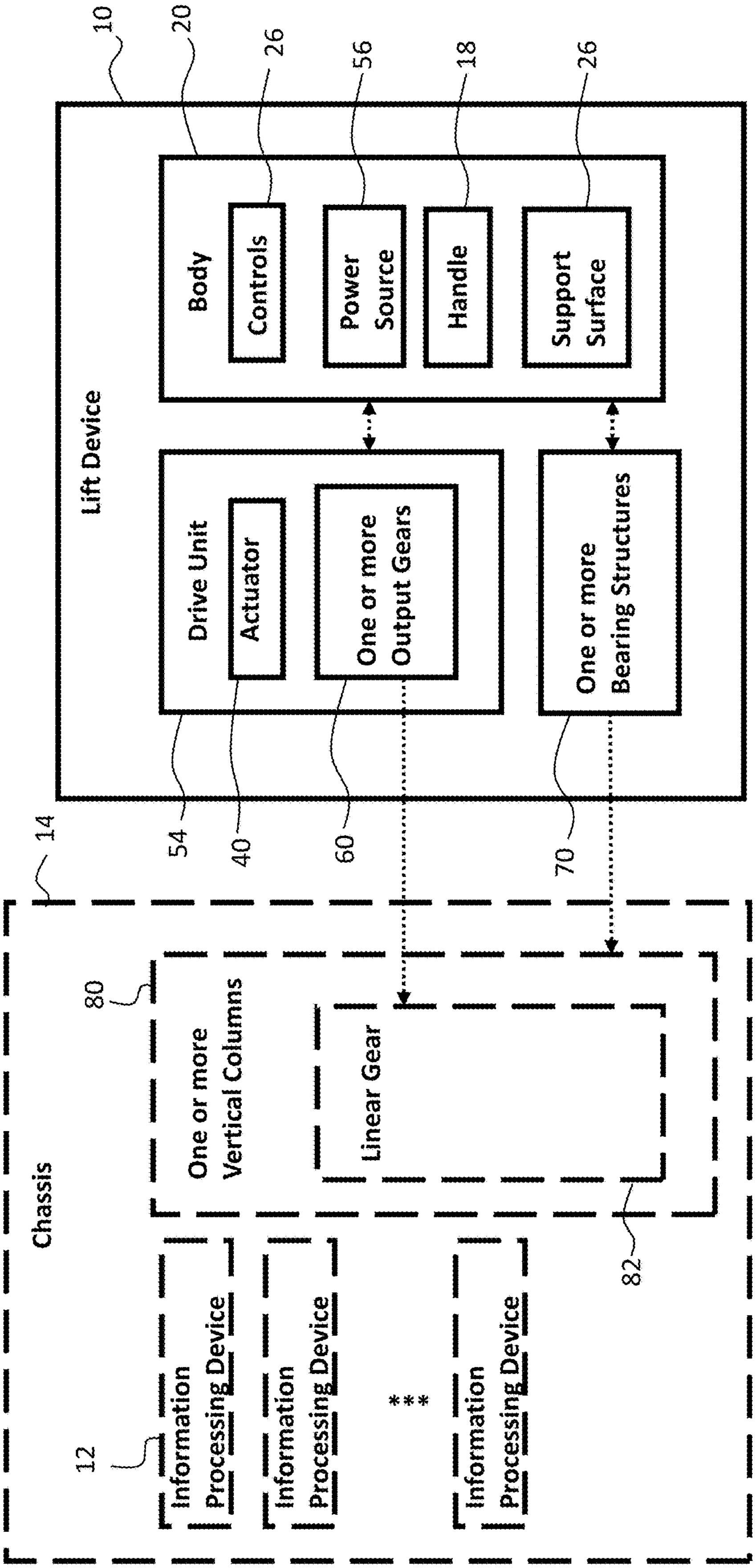
FIG. 1 is a block diagram illustrating a lift device.

As noted above, installation, removal, and service of information processing devices housed in chassis is challenging due to the weight of the information processing devices housed therein, the variable heights that the information processing devices are installed within the chassis, and safety concerns with respect to the technicians carrying out such tasks. Information processing devices, such as individual servers, can often weigh between 50 and 80 pounds or even exceed 80 pounds. Safety issues concerning the weight of the information processing devices are further compounded by the various heights at which they are installed in the chassis. Standard racks and cabinets that house the information processing devices often range in height from 73.5 inches to 84 inches. Without auxiliary tools to assist, technicians are at risk of injuries associated with repetitive lifting, fatigue, and blunt force trauma. Even if a technician avoids injury during installation, extraction, or service of housed information processing devices, there remains a risk of dropping and damaging an information processing device or damaging other objects in close proximity resulting in repair and/or replacement costs. For these and other reasons, technicians rely upon auxiliary devices to reduce the likelihood of injury, ensure compliance with safety standards, reduce the likelihood of accidental damage to equipment, and facilitate the installation, removal, and service of information processing devices housed in tall chassis.

Presently, technicians utilize traditional mechanical lifts to install, remove, or service information processing devices housed in racks cabinets or other chassis. However, traditional mechanical lifts are heavy and have large footprints that occupy a significant area. These design features are intended to improve overall stability by lowering the center of gravity, compensating for the weight of loads received, and distributing weight over a wider area. Traditional mechanical lifts have a weight between 110 to 440 pounds, including ballast, which limits portability and renders them difficult and costly to transport between locations in different cities and/or countries. Further, the large footprint of traditional mechanical lifts decreases maneuverability which decreases functionality. For example, dimensions associated with the traditional mechanical lifts may include a height ranging from about 4 ft. to about 14 ft., length ranging from about 1 ft. to about 4 ft., and width ranging from about 2 ft. to about 4 ft. These traditional mechanical lifts often need to be deployed in places having limited free space, such as in a room (e.g., server room) with racks or other equipment which are tightly arranged, and thus it takes substantial time and effort to navigate a traditional mechanical lift into the position where it is required. The size and weight of traditional mechanical lifts also frequently results in damage to walls, server racks, and fire sprinklers during positioning. Even when a traditional mechanical lift is positioned as desired, while deployed the mechanical lift may block or inhibit others from accessing other nearby racks, and thus the use of the lift may preclude or render more difficult the simultaneous servicing of multiple racks in a given region. In particular, when such a lift is utilized in a space that comprises rows of racks with access isles running therebetween, generally only a single rack per isle can be serviced at a time, as the size of the lift precludes a different lift from navigating through that isle to different racks in the same row or in the adjacent row that shares the same isle. As such, service is slowed and simultaneous work on more than one rack at a time is rendered more difficult or may not be possible.

Additionally, due to the size and weight of information processing devices as well as traditional mechanical lifts, safety rules or best practices (which may be promulgated by a company, industry, or government body) may require more than one technician to be present during extraction, installation, or service of such information processing devices. Requiring additional technicians to be present increases cost and may decrease the rate at which other tasks requiring their attention are completed. Further, it can be both difficult and expensive to arrange and provide service to remote areas which otherwise lack traditional mechanical lifts or multiple technicians. In view of the same, it can be challenging to find alternate methods or tools which safely accomplish the same task as traditional mechanical lifts, without the drawbacks of traditional mechanical lifts, and which satisfy safety rules and best practices.

To address these and other issues, examples disclosed herein provide highly portable and compact lifts that can be used to assist in removal, installation, and service of information processing devices housed in racks, cabinets, or other chassis. These lifts can removably attach to and climb vertically along the chassis (via vertical columns which are either part of, or are coupled to, the chassis), thus forming a movable platform which can raise or lower an information processing device. In examples disclosed herein, the chassis supports the lift as it climbs, and thus the large footprint and heavy ballast usually needed to stabilize traditional mechanical lifts can be omitted. Thus, the example lifts disclosed herein are light in comparison to both traditional mechanical lifts as well as the information processing devices they service, and are small in comparison to traditional mechanical lifts. Being light and small allows the example lifts to be highly maneuverable in compact spaces and easy to transport between locations, whether it be different rooms in a building, different buildings, different cities, or different countries. Further, in some examples existing racks, cabinets, or other chassis can be easily and inexpensively adapted or retrofitted to work with the example lifts disclosed herein. In other examples, the lift may be used with a rack, cabinet, or other chassis designed specifically to complement the example lift devices. In some examples, the lifts can be manufactured utilizing cost-effective manufacturing techniques and can utilize inexpensive and readily available components, such as commercially available motors and power sources.

Some example lifts disclosed herein include a body, a drive unit including an actuator and one or more output gears operably coupled to the body, and one or more bearing structures attached to the body adjacent the one or more bearing structures. The examples disclosed herein have a first, attached, state where the lift device is removably attached to, and translatable vertically along, one or more vertical columns that are attached to, or integral with, a chassis that houses information processing devices. The examples disclosed herein also have a second, detached, state where the lift device is detached from the one or more vertical columns of the chassis and can be easily maneuvered or transported to different locations with ease. Because of the configuration of the one or more output gears relative to the one or more bearing structures, the examples disclosed herein effectively utilize the chassis, and any information processing devices housed therein, as ballast. As such, the need for independent ballast is eliminated. Elimination of independent ballast significantly reduces both weight and size of the examples disclosed herein with respect to traditional mechanical lifts. Even without independent ballast, the examples disclosed herein provide a secure, stable, and safe platform to install, remove, or service the information processing devices housed in the chassis.

Specific to the attached state, the configuration of the one or more output gears relative to the one or more bearing structures ensures that each of the one or more output gears and the one or more bearing structures are respectively positioned on opposite sides of the one or more vertical columns. Gravity biases each of the one or more output gears and the one or more bearing structures respectively towards the one or more vertical columns from opposite directions providing a strong and resilient engagement. Additional features may also be included to further attach and/or secure the examples disclosed herein to the one or more vertical columns when in an attached state.

With respect to the detached state, the reduced weight of the examples disclosed herein in combination with the configuration of the one or more output gears relative to the one or more bearing structures also ensures easy maneuvering that requires significantly less effort and route planning than traditional mechanical lifts. In the detached state, the examples disclosed herein contact and travel along the ground via the one or more bearing structures thereby reducing resistance. Some examples may even be carried like a suitcase or piece of luggage. Still referencing the detached state, the examples disclosed herein may have dimensions and weight proximate to, or within, airline requirements associated with carry-on luggage and/or checked luggage thereby enabling fast and easy transport to offsite locations including remote locations. When extraction, installation, or service of housed information processing devices is required, the examples disclosed herein can safely and easily attach to the one or more vertical columns while also ensuring a safe and easy detachment.

In some examples, the lift devices disclosed herein may be included in one or more systems. One example of a system disclosed herein comprises a system for lifting an information processing device relative to a chassis. The system may include an example implementation of the lift device disclosed herein and one or more vertical columns configured to be removably attached to a rack, chassis, or cabinet. Another example of a system disclosed herein comprises a chassis system including a chassis configured to receive a plurality of information processing devices, one or more vertical columns removably attached to, or integral with, the chassis, and an example implementation of the lift device disclosed herein. The example implementations of the lift device described herein are applicable to either system.

Turning now to the figures, various devices, systems, and methods in accordance with nonlimiting aspects of the present disclosure will be described. In the following description, directional/relational terms such as bottom, top, front, back, above, below, and the like are used to aid understanding, but these terms are used only in relation to the orientations and arrangements depicted in the figures and are not intended to imply anything about the locations or orientations of the parts in other contexts, such as relative to an external reference frame. In particular, lift devices disclosed herein may be oriented in different orientations from the illustrated orientations, and the usage herein of directional or relationship terms relative to the illustrated orientations should not be misunderstood as limiting the orientations of the lift devices. Thus, for example, a lift device described herein as having a bottom surface and a top surface (with the top surface being positioned above the bottom surface in the illustrated orientation) may be positioned in a manner that is rotated relative to the illustrated orientation such that the top surface is no longer located above the bottom surface in the new orientation. In addition, the directional term "vertical" may be used herein relative to the lift device, the support surface, and the one or more vertical columns, to refer to directions that are parallel to the direction of Earth's gravitational field in the vicinity of the structures in question (i.e., a radial direction relative to the Earth's center). In other words, "vertical" directions may be perpendicular to the ground or floor supporting the lift device or chassis, assuming the ground or floor is level. The term "horizontal" may also be used herein to refer to directions that are perpendicular to the vertical direction. In other words, "horizontal" directions may be parallel to the ground or floor supporting the lift device or chassis, assuming the ground or floor is level.

FIG. 1 is a block diagram conceptually illustrating a lift device 10. In addition to the lift device 10, FIG. 1 also illustrates a chassis 14 with which the lift device 10 may be used. In some examples, the chassis 14 together with the lift device 10 may form a lifting system 5. In other examples, the lift device 10 may be provided separately from the chassis 14, and thus the chassis 14 is illustrated in FIG. 1 in dashed lines. It should be understood that FIG. 1 is not intended to illustrate specific shapes, dimensions, or other structural details accurately or to scale, and that implementations of the lift device 10 may have different arrangements of the illustrated components and may also include other parts that are not illustrated.

As shown in FIG. 1, the lift device 10 comprises a body 20, a drive unit 40 that includes an actuator 54 and one or more output gears 60, and one or more bearing structures 70. The drive unit 40 is coupled to the body 20 and the actuator 54 is operably coupled to the drive unit 40 to drive rotation of the one or more output gears 60. The lift device 10 is configured to have a first, attached, state and a second, detached, state.

In the attached state, the lift device 10 is removably attached to a chassis 14 via one or more vertical columns 80. The chassis 14 comprises a rack (e.g., server rack), a cabinet (e.g., server cabinet), a system housing, or any other type of support structure that is configured to house multiple information processing devices 12 (e.g., servers, networking equipment, etc.) in a vertically stacked arrangement. In some examples, the one or more vertical columns 80 are removably attached to the chassis 14. In other examples, the one or more vertical columns 80 are integral with the chassis 14. At least one of the vertical columns 80 comprises a linear gear 82, which comprises engagement elements (e.g., protrusions and/or recesses/apertures) which are configured engage with (mesh with) gear teeth of the output gear 60 and which extend in a line along the vertical column 80. Each of the one or more bearing structures 70 is configured to, in the attached state, engage with and movably bear against (e.g., roll along, slide along, etc.) one of the vertical columns 80, and each of the output gears 60 is configured to, in the attached state, engage with a linear gear 82 portion of one of the vertical columns 80. In some examples, at least one of the bearing structures 70 and at least one of the output gears 60 are arranged to engage with the same vertical column 80 as one another, and the bearing structure 70 engages one side thereof (e.g., a rear side) while the output gear 60 engages the opposite side thereof (e.g., a front side) so that the vertical column 80 is sandwiched or clamped between the bearing structure 70 and the output gear 60. Moreover, the bearing structure 70 and the output gear 60 engage the vertical column 80 in a manner that transfers the weight of the lift device 10 to the vertical column 80. In particular, the engagement of the output gear 60 with the linear gear 82 supports the lift device 10 vertically, whereas the engagement of the bearing structure 70 with the vertical column 80 prevents the lift device 10 from pivoting about the output gear 60, thus holding the lift device 10 in a generally horizontal orientation. The bearing structure 70 also prevents the output gear 60 from moving horizontally away from the linear gear 82, thus holding the output gear 60 in engagement with the linear gear 82. In this manner, the lift device 10 in the attached state is supported in a cantilevered manner by the vertical column 80 via engagement with the bearing structure 70 and the output gear 60. Moreover, in this attached state, rotation of the output gears 60 causes the output gears 60 to move along the linear gear 82, hence causing the lift device 10 to translate up and down along the vertical columns 80. During this vertical translation, the bearing structure 70 also moves along the vertical columns 80 (e.g., rolling or sliding) while continuing to bear against the vertical columns 80 and thus continuing to maintain the lift device 10 in a horizontal orientation throughout the vertical movement.

In the detached state, the lift device 10 is not coupled to the vertical columns 80 and is free to maneuver and may be easily and inexpensively transported to other locations without requiring disassembly or special packaging. For example, in some examples the bearing structures 70 may also be configured to movably support the lift device relative to the ground when the lift device 10 is in the detached state. In some examples, the lift device 10 can be positioned in any arbitrary orientation while in the detached state. For example, in the detached state, the lift device 10 may be oriented with the support surface 26 vertical or at an angle between vertical and horizontal while being moved around, as such orientations may enable the bearing structures 70 to contact and movably bear against the ground or floor.

The body 20 may comprise top and bottom surfaces opposite one another, a support surface 26 and a rear surface opposite one another and each extending between the top and bottom surfaces, and two lateral surfaces opposite one another and extending between the support surface 26 and the rear surface. The one or more bearing structures 70 and the output gears 60 may be disposed on one or both of the lateral surfaces near the bottom side of the body 20 such that, in the attached state of the lift device 10 to the chassis 14, the bottom surface of the body 20 faces the chassis 14 and the support surface, rear surface, and lateral surfaces each extend away from the chassis 14. In the attached state of the lift device 10, the support surface 26 is approximately horizontal and faces upward, forming a platform which may support an information processing device 12 disposed thereon. For example, to remove an already housed information processing device 12, the lift device 10 may be attached to the vertical columns 80 and then may be moved vertically along the vertical columns 80 by driving rotation of the output gears 60 until the support surface 26 is aligned with or slightly below a bottom edge of the target information processing device. The information processing device 12 may be pulled horizontally out of and become electrically physically disconnected from the chassis 14. As the information processing device 12 is moved out of the chassis, the information processing device 12 may simultaneously be moved progressively onto the support surface 26. The electrical disconnection may occur prior to moving the information processing device 12 out of the chassis 14 (e.g., by removing cables), or may occur as a result of moving the information processing device 12 out of the chassis 14 (e.g., by disconnecting from a backplane in the chassis 14). If the information processing device 12 is vertically supported in the chassis by a horizontal divider wall or other similar supports without fasteners, then the physical disconnection from the chassis 14 may also occur automatically as a result of the information processing device 12 being pulled out of the chassis 14, as the information processing device 12 will eventually disengage from the supports when pulled sufficiently far outward. If the information processing device 12 is connected to the chassis 14 via fasteners (such as by fastening to a telescoping rail of the chassis 14), physical disconnection may involve disengaging the fasteners. Once the information processing device 12 is disconnected from the chassis 14 and resting upon the lift device 10, the lift device 10 may be moved vertically (by driving the output gears 60) to bring the information processing device 12 to a desired height which is convenient for the technician's intended next steps. For example, the technician may service the information processing device 12 as it rests upon the support surface 26, or the technician may remove the information processing device 12 from the support surface 26 to a conveyance mechanism (e.g., cart) to transport the information processing device 12 elsewhere. To install a new, or replace a previously removed, information processing device 12, the reverse sequence of events may be performed.

In some examples, the lift device 10 is configured to transition from the detached state to the attached state by the following sequence (engagement with just one vertical column 80 is described to aid understanding, but if multiple vertical columns 80 are present, the engagement with those may proceed in a similar fashion).

First, the lift device 10 is moved into a position adjacent chassis 14 with the support surface 26 being vertically oriented and facing the chassis 14 and with at least one of the output gears 60 being aligned with and adjacent to the front side of one of the vertical columns 80 (in some cases, the output gear 60 is engaged with the linear gear 82 in this state). As the lift device 10 is moved into this position, a first one of the bearing structures 70 moves from being in front of one of the vertical columns 80 to being at least partially behind the vertical column 80 by passing under a bottom end of the vertical column 80 via a gap between the vertical column 80 and the ground. However, in this position the bearing structure 70 is not yet engaged with the vertical column 80.

Next, the lift device 10 is rotated (tilted) away from the chassis 14 (i.e., in a direction which rotates the support surface 26 towards a horizontal orientation), with the body 20 pivoting about a pivot point on the bottom side of the body 20 spaced apart from the first bearing structure 70. For example, the pivot point may be a second one of the bearing structures 70, which is spaced apart from the first bearing structure 70 and in contact with the ground during the tilting. The tilting may be facilitated, for example, by a user manually pulling back on a top portion of the body 20 (e.g., via the handle 18), generating a torque on the body 20 that causes it to pivot about the pivot point. In some examples, instead of or in addition to the user manually applying a rearward force to the body, the tilting may be facilitated by driving the output gear 60 to rotate, which may apply an upward force to a bottom corner of the body 20, thus resulting in a torque on the body 20 that causes it to tilt. The torque (whether manually applied or applied via driving the output gears 60) may have a tendance to urge the lift device 10 to move away from the chassis 14 rather than pivoting, and thus an opposing force may be applied to the body 20 to resist this tendency and to hold the lift device 10 near the chassis 14 during the initial stages of tilting (e.g., until the bearing structure 70 engages the vertical column 80). In some examples, this opposing force may be provided by friction between the body 20 and the ground. In some examples, the user may manually apply the opposing force (e.g., via a foot pressed against the body 20).

The rotating (tilting) of the lift device 10 causes the first bearing structure 70 to move upward and eventually engage with a rear side of the vertical column 80. At this point, the bearing structures 70 now prevent the body 20 from moving away from the chassis 14, and thus the aforementioned opposing force may no longer needed. After this engagement of the bearing structure 70 with vertical column 80 occurs, lift device 10 may be further rotated in the same direction until the support surface 26 is horizontal, resulting in the attached state being achieved. As the lift device 10 is rotated in this manner, the pivot point about which the lift device 10 pivots may be pulled progressively towards the chassis 14, due to the engagement of the first bearing structure 70 with the vertical column. In examples in which the pivot point comprises a second bearing structure 70, eventually this second bearing structure 70 passes under the vertical column 80 to a rear side thereof. Some or all of this rotation of the lift device 10 may be facilitated by driving the output gears 60. Once the lift device 10 is oriented with the support surface 26 horizontal, the attachment is complete, and at least one output gear 60 and one bearing structure 70 are fully engaged with the vertical column 80. Thereafter, further driving of the output gears 60 will cause vertical translation of the lift device 10 along the vertical columns 80, with the support surface 26 remaining horizontal (further pivoting/rotation of the lift device 10 now being prevented by the full engagement of the output gear 60 and bearing structure 70 with the vertical column).

Transitioning the lift device 10 from the attached state to the detached state may be achieved by driving the output gears 60 to move the lift device 10 to the bottom of the vertical columns 80 and then executing the above-described sequence in reverse.

In some examples, the lift device 10 may comprise controls 34 in communication with the actuator 54, a power unit 56 to supply power to the actuator 54 and the controls 34, and a handle 18 that is fixed or retractable. Each of the controls 34, the power unit 56, and the handle 18 may be disposed on or in the body 20.

The drive unit 40 is configured to provide motive power for driving the rotation of the output gears 60, and thereby the drive unit 40 drives the above-described vertical motion of the lift device 10 along the vertical columns 80. The drive unit 40 may comprise an actuator 54 which generates a driving torque and a drivetrain which transmits the torque to the output gears 60. The drive train may comprise one or more drive shafts, one or more outputs, one or more inputs, and one or more gear steps that operably couples the actuator 54 to the one or more output gears 60 to transmit torque between the same. In some examples, the drive train comprises a worm gear (not illustrated) which is coupled to one or more of the output gear 60, and which provides a form of passive braking for the output gear 60 to prevent back-driving (e.g., the worm gear may prevent the lift device 10 from being unintentionally pulled downward by the weight of the lift device 10 without requiring the actuator 54 to actively supply torque to maintain the position of the lift device 10). In some examples, the actuator 54 of the drive unit 40 may comprise a commercially available electric motor that fits within the body 20. In some examples, the power unit 56 may comprise a commercially available battery unit and circuitry configured to electrical couple the battery unit to the actuator 54. In some examples, the battery unit may be removable and may be removably coupled to the body 20 via a corresponding electrical connector configured to receive and mate with a connector of the battery unit. In some examples, a removable battery unit may be removed from the lift device 10 and charged at an external charging unit. In some examples, the battery unit may be permanently installed and may be recharged via plugging the lift device 10 into an external power source. In some examples, the power unit 56 does not comprise a battery unit and instead comprises a connection (e.g., power cord) for connecting to and receiving power from an external power source (e.g., electrical socket).

The one or more bearing structures 70 may comprise wheels, skids, rollers, other bearing structures, or a combination of wheels, skids, rollers, or other bearing structures.

The lift device 10 may comprise a plurality of materials. In some example implementations, the body 20 of the lift device 10 comprises sheet metal. The sheet metal may comprise metal, including, but not limited to steel, aluminum, titanium, and alloys including the same. In some implementations, the sheet metal has a thickness from about 1.0 millimeters to about 3.0 millimeters. In other examples, the body 20 may comprise a plastic that is rigid and resilient, including, but not limited to high-density polyethylene, polycarbonate, polyamide-imide, high impact polystyrene, and acrylonitrile butadiene styrene. In examples including a handle 18, the handle 18 may comprise metal, including, but not limited to steel, aluminum, titanium, and alloys including the same. In some examples, the handle 18 comprises a plastic that is rigid and resilient, including, but not limited to high-density polyethylene, polycarbonate, polyamide-imide, high impact polystyrene, and acrylonitrile butadiene styrene.

The one or more output gears 60 may comprise metal or a plastic that is rigid and resilient. In some example implementations, the metal includes, but is not limited to steel, aluminum, titanium, and alloys including the same. In other examples, the plastic includes, but is not limited to high-density polyethylene, polycarbonate, polyamide-imide, high impact polystyrene, and acrylonitrile butadiene styrene. In examples where the drive train includes a gear train, the gear train may comprise metal or a plastic that is rigid and resilient. The metal may include, but is not limited to steel, aluminum, titanium, and alloys including the same. In other examples, the one or more output gears 60 comprise a plastic, including, but not limited to high-density polyethylene, polycarbonate, polyamide-imide, high impact polystyrene, and acrylonitrile butadiene styrene.

In some examples, the one or more bearing structures 70 comprise metal, including, but not limited to steel, aluminum, and alloys including the same. In other examples, the one or more bearing structures 70 comprise an elastomer, e.g., a rubber wheel, and/or a plastic, including, but not limited to high-density polyethylene, polycarbonate, polyamide-imide, high impact polystyrene, and acrylonitrile butadiene styrene.

It is contemplated that components of the lift device 10 are not limited to any single material and may include a combination of materials discussed above.

Figure 2:
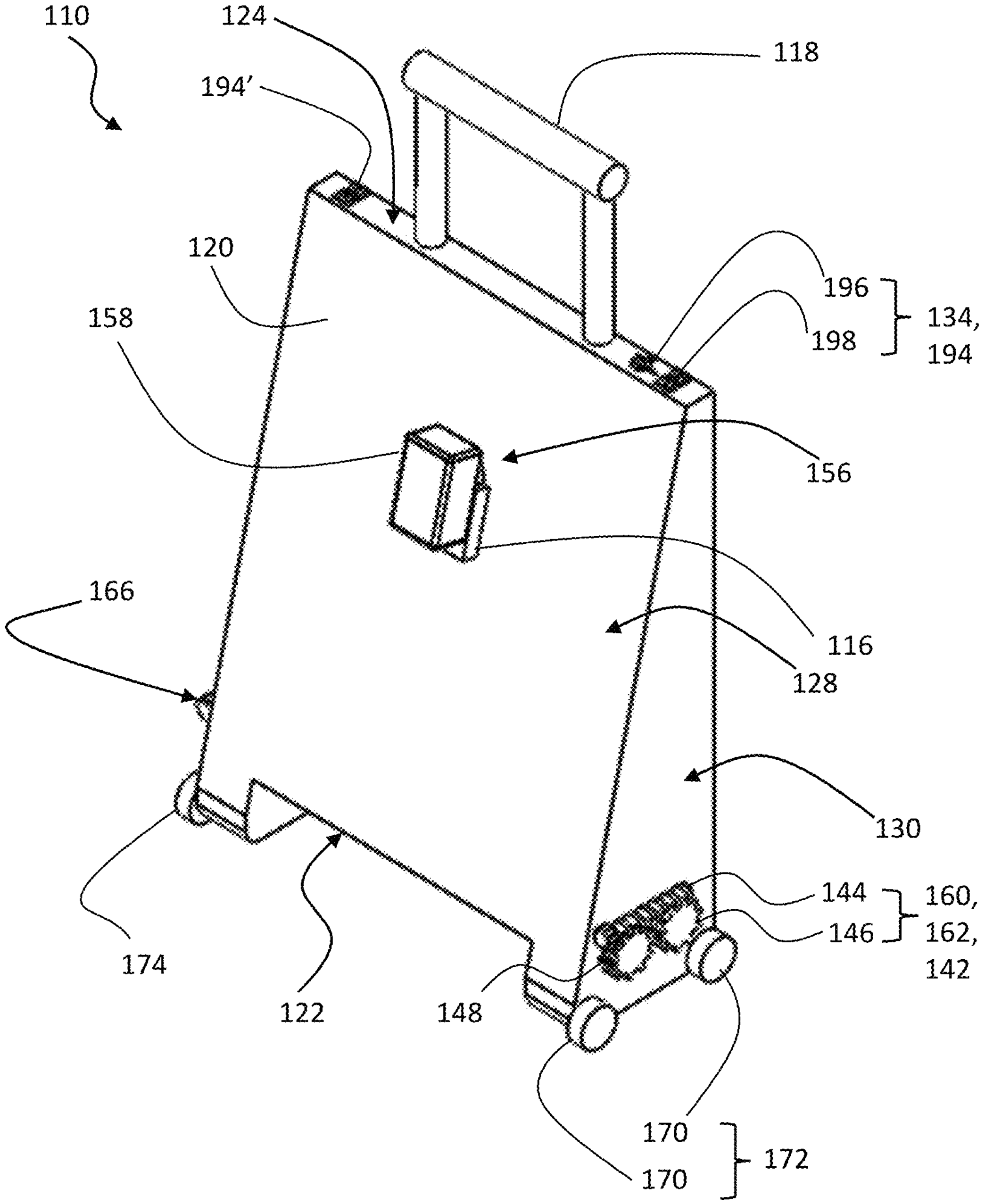
FIG. 2 is a top perspective view of an example implementation of a lift device.

Turning now to FIG. 2, an example lift device 110 is described. The lift device 110 is one example configuration of the lift device 10 described above, with respect to FIG. 1. Accordingly, some components of the lift device 110 are similar to (e.g., specific configurations of) components of the lift device 10 described above. Similar components are referred to using the same last two digits, such as 20 and 120. The descriptions of components of the lift device 10 are applicable to the similar components of the lift device 110, and thus duplicative description of various aspects already described above may be omitted below. Although the body lift device 110 is one configuration of the lift device 10, the lift device 10 and the components thereof are not limited to the lift device 110 and the components thereof.

The lift device 110 comprises at least a body 120, a drive unit 140 including an actuator (not shown) and multiple output gears 160, and multiple bearing structures 170. The body 120 is one example configuration of the body 20 described above with respect to FIG. 1.

Figure 6A:
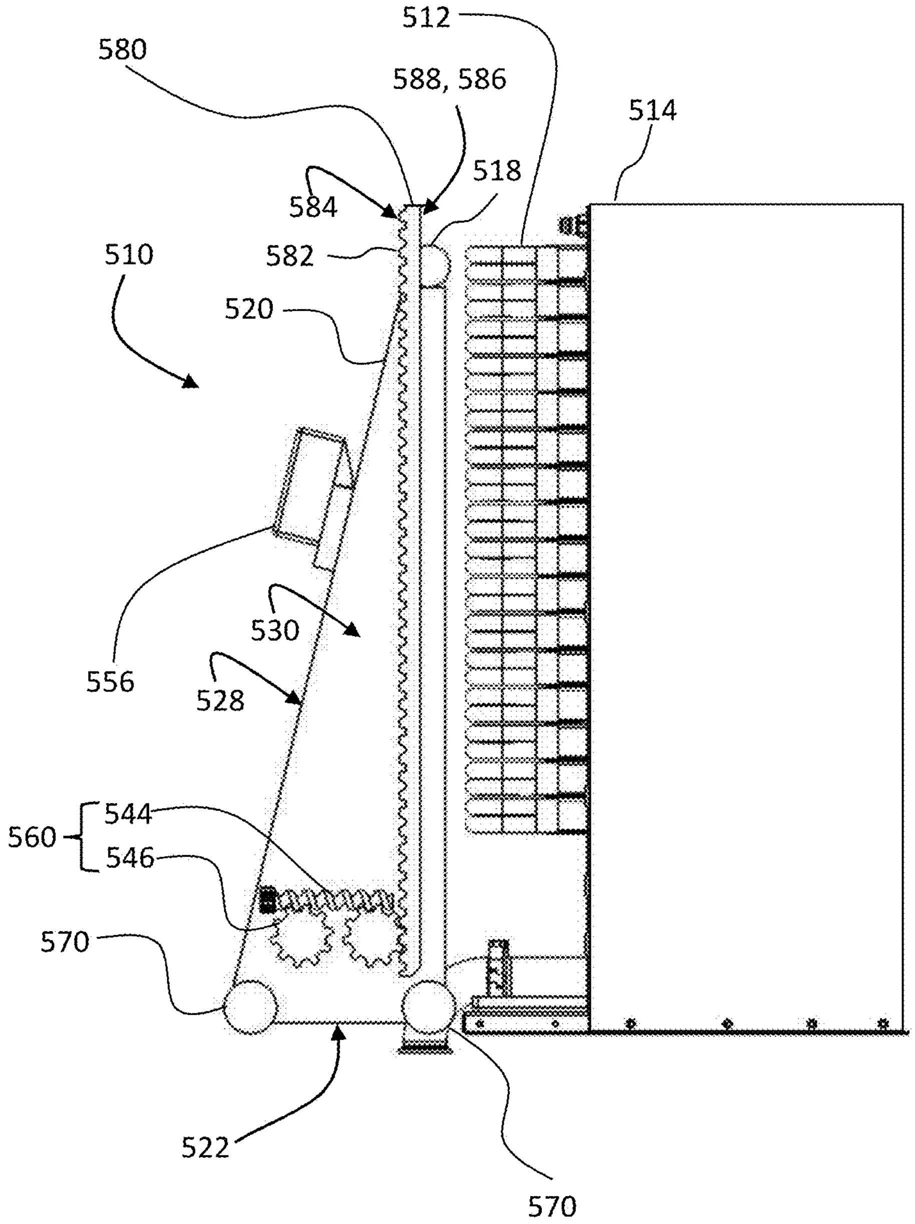
FIG. 6A is a side view of an example lift device positioned adjacent an example implementation of a chassis, the example lift device in a first, detached, state.
Figure 6B:
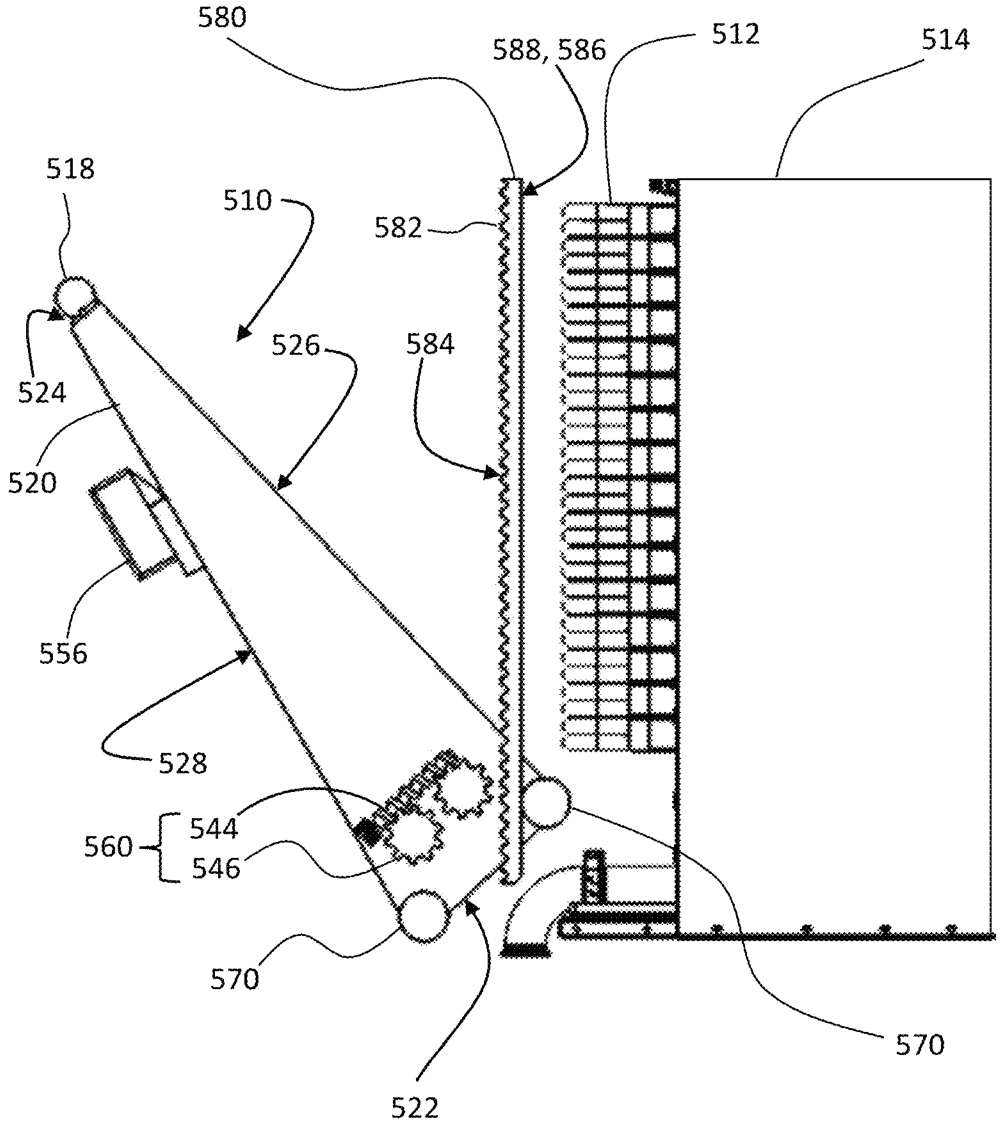
FIG. 6B is a side view of the example lift device transitioning from the first, unattached, state illustrated in FIG. 6A to a second, attached, state illustrated in FIG. 6C.
Figure 6C:
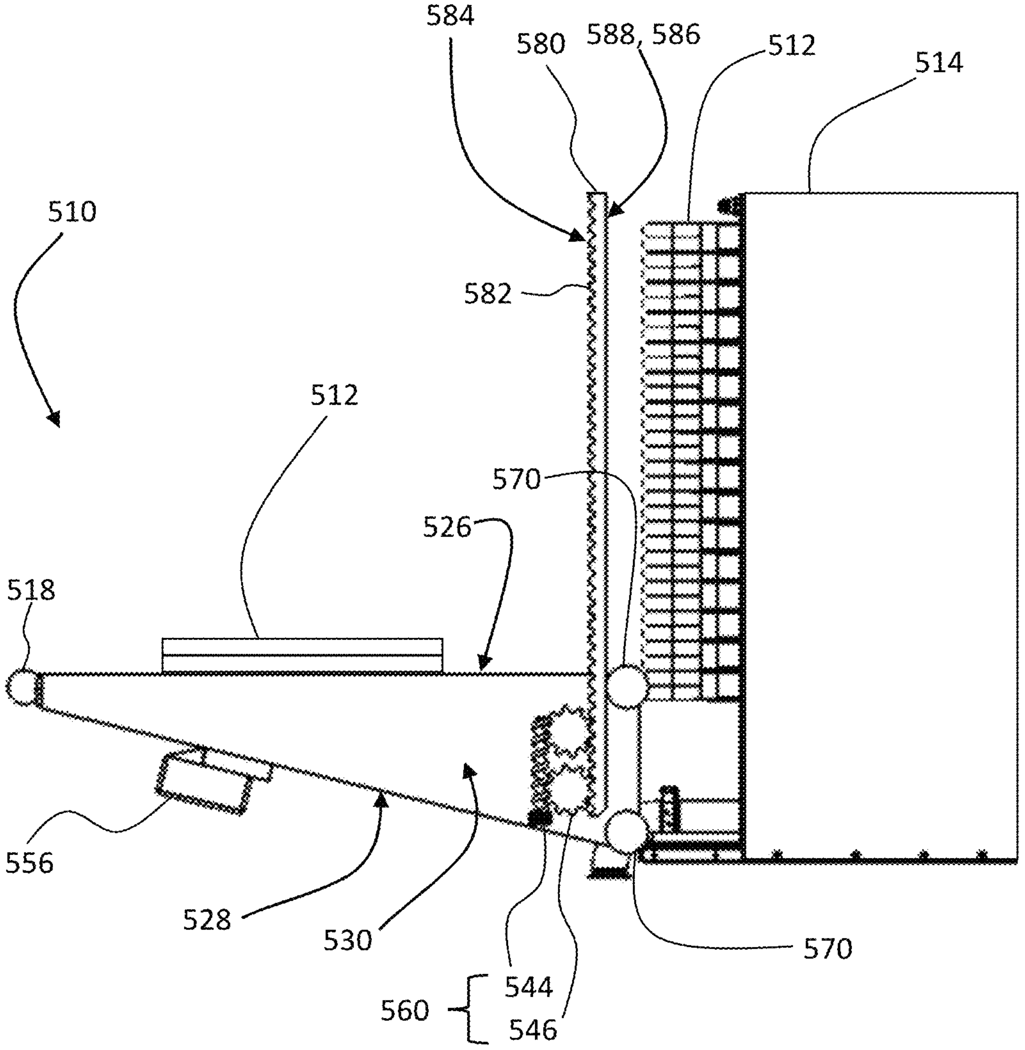
FIG. 6C is a side view of the example lift device in the second, attached, state.

As explained above, a lift device 110 may comprise a body 120, the body 120 may comprise a plurality of surfaces defined relative to the lift device 110 in the detached state as illustrated in FIG. 2. The plurality of surfaces may include a bottom surface 122 adjacent to the bearing structures 170, a top surface 124 spaced from and opposite the bottom surface 122, a support surface (not shown) extending between the bottom surface 122 and the top surface 124, and a rear surface 128 spaced from and opposite the support surface and extending between the bottom surface 122 and the top surface 124. Although the support surface is not visible in FIG. 2, the support surface 526 illustrated in FIGS. 6A-6C is similar to the support surface of the body 120.

When the example lift devices disclosed herein are in the attached state, the support surface is configured to receive and support one or more information processing devices (not shown) for installation into and extraction from a chassis (e.g., a rack, a cabinet, or other type of chassis) (not shown) configured to house the one or more information processing devices. Accordingly, in the attached state, the support surface is configured to support the one or more information processing devices during installation, extraction, and service and/or maintenance of the same. When the lift device 110 transitions from the detached state to the attached state, or from the attached state to the detached state, the plurality of surfaces discussed above will rotate approximately 90° as illustrated in FIGS. 6A-6C. Accordingly, the plurality of surfaces have at least two different orientations dependent upon the state, detached or attached, of the lift device 110. For example, when the lift devices disclosed herein are in the detached state, the support surface is substantially vertical and perpendicular relative to a ground surface. However, when the example lift devices disclosed herein are in the attached state, the support surface is substantially horizontal and parallel to the ground surface.

The body 120 may comprise a first side surface 130 and a second side surface (not shown) spaced from and opposite the first side surface 130. The first side surface 130 and the second side surface each extend from the support surface 126 to the rear surface 128. The first and second side surfaces may be roughly parallel to a first plane and a second plane, respectively. When the lift device 110 transitions from the detached state to the attached state, or from the attached state to the detached state, the first and second side surfaces may rotate within the first and second planes, respectively. However, as illustrated in FIGS. 6A-6C, the first and second side surfaces do not transition between a vertical orientation and a horizontal orientation as opposed to the bottom, top, support, and rear surfaces.

In some examples, some of the output gears 160 and the bearing structures 170 are disposed on the first side surface 130, while other output gears 160 and bearing structures 170 are disposed on the second side surface. More specifically, as also illustrated in FIG. 2, the output gears 160 comprise a first set of output gears 162 and a second set of output gears 166 spaced from and opposite the first set of output gears 162. Additionally, the bearing structures 170 include a first set of bearing structures 172 and a second set of bearing structures 174 spaced from and opposite the first set of bearing structures 172. In some examples, the first set of output gears 162 and the first set of bearing structures 172, will engage a first vertical column, whereas the second set of output gears 166 and second set of bearing structure 174 will engage a second vertical column. As will be described in greater detail with reference to FIG. 4A-4B below, each of the first and second vertical columns comprise a first side including a linear gear and a second side spaced from and opposite the first side, wherein the second side includes a bearing surface. An actuator (not visible) drives rotation of the output gears 160 which in turn drives vertical translation of the lift device 110 relative to the one or more vertical columns, as described above in relation to FIG. 1.

As shown in FIG. 2, in this example the first set of output gears 162 comprise a worm drive 142. The worm drive 142 comprises a worm screw 144 and one or more worm wheels 146, 148. The worm screw 144 is operably coupled to the actuator (e.g., via linkages internal to the body 120, and thus not visible in FIG. 2), such that the actuator drives rotation of the worm screw 144 which in turn drives rotation of the worm wheels 146 and 148. Although inclusion of two worm wheels is 146, 148 one configuration of the lift device 110, the lift device 110 and the components thereof are not limited to such a configuration. Although not visible in FIG. 2, the second set of output gears 166 may also comprise a worm drive similar to the worm drive 142. As briefly describe above, example implementations including one or more output gears 160 comprising a worm drive 142 advantageously provide a passive brake which requires no additional parts and will be described in greater detail with respect to FIGS. 6A-6C. Although inclusion of a worm drive 142 is one configuration of the lift device 110, the lift device 110 and the components thereof are not limited to such a configuration. It is contemplated that other types of gears, e.g., spur, helical, bevel, spiral bevel, and/or different arrangements of gears relative to the illustrated example in FIG. 2 may be incorporated with and/or substituted for the depicted worm drive 142.

As shown in FIG. 2, the first set of bearing structures 172 comprises two bearing structures 170 attached to the first side surface 130 near the bottom edge thereof. Similarly, the second set of bearing structures 174 comprises two bearing structures 170 on the opposite second side surface 132. In this example, the bearing structures 170 are configured to engage with the ground and movably support the lift device 110 relative to the ground while the lift device 110 is in the unattached state. The bearing structures 170 are also configured to engage the vertical columns in the attached state, as described above in relation to FIG. 1. In particular, the bearing structures 170 and the worm wheels 146 and 1418 are spaced apart from one another so as to define a channel or space therebetween into which one of the vertical columns can be received in the attached state. In the example illustrated in FIG. 2, the bearing structures 170 are depicted as wheels. However, the one or more bearing structures are not so limited and may comprise wheels, skids, rollers, or a combination of wheels, skids, and rollers. The one or more bearing structures will be described in greater detail below with respect to attaching and detaching the example lift devices disclosed herein to the one or more vertical columns.

In the example illustrated in FIG. 2, the body 120 comprises a power unit 156 disposed on the rear surface 128 of the body 120 to power the actuator 154. The actuator 154 drives the output gears 160 which in turn drive vertical translation of the lift device 110. The drive unit 140 will be described in greater detail with respect to FIG. 3. In other examples, the power unit 156 may be disposed on the top surface 124, the support surface 126, or on one of the first and second side surfaces 130, 132 of the body 120. The power unit 156 may include a battery 158 that is removably attached to a battery interface 116 that is fixed to, or integral with, the rear surface 128, the support surface 126, the top surface 124, the first side surface 130, or the second side surface 132. In the example illustrated in FIG. 2, the power unit 156 is disposed on the rear surface 128 and the battery interface 116 is fixed to the rear surface 128. The battery 158 may comprise a rechargeable battery including a commercially available rechargeable battery, such as a rechargeable battery configured for handheld cordless power tools.

As also illustrated in FIG. 2, the body 120 may comprise controls 134 in communication with the actuator 154. In the illustrated example, the controls 134 are disposed on the top surface 124 and include a power switch 196 to activate or deactivate the lift device 110 and one or more movement switches 198 that signal the actuator 154 to drive the output gears 160 which then drive vertical translation of the lift device 110 upward or downward. In the illustrated example, the one or more movement switches may comprise an up switch 136 to control upward vertical translation and a down switch 138 to control downward vertical translation. In some examples, a single movement switch controls both upward and downward vertical translation of the lift device 110. As also illustrated, the one or more movement switches 198 may include a first set of switches 194 disposed opposite and spaced from a second set of switches 194', each of the first and second sets of switches 194, 194' are disposed on the top surface 124 of the example lift device 110. Such examples including the first and second sets of switches 194, 194' may allow for easier access to one of the first and second sets of switches 194, 194' regardless of a technician's position relative to the lift device 110 or the technician's dominate hand. It is contemplated that the one or more movement switches 198 may be disposed on a surface of the body 120 other than the top surface 124. It is also contemplated that one or more surfaces of the plurality of surfaces, different from the top surface 124, may include additional movement switches or sets of switches to further improve access to the controls 134 and simplify operation of the lift device 110.

In some examples, the controls 134 may include one or more lock switches (not shown) to reduce the risks associated with equipment failure, power failure, and/or unintentional movement of the lift device 110. The one or more lock switches, when engaged, prevent communication between the one or more movement switches and the actuator. Blocking signals from the controls 134, or to the actuator, prevent the actuator from driving the output gears 160. When the lift device 110 is in the detached state, activation of the one or more lock switches will prevent unintentional activation of the lift device 110, unintentional rotation of the output gears 160, and a drain of the battery 158 if the battery 158 is removably attached to the battery 158 interface. When the lift device 110 is in the attached state, activation of the one or more lock switches will lock the lift device 110 at its current position and prevent vertical translation of the lift device 110. In some examples, the one or more lock switches, when engaged, actuate a mechanical lock (not shown) that physically blocks the output gears 160 from being driven, or rotated, in any direction. In other examples, activation of the one or more lock switches, when engaged, actuate a different mechanical lock (not shown) that physically engages the one or more vertical columns 180 thereby preventing movement of the lift device 110 about the same. In yet other examples, the arrangement and selection of the output gears 160, e.g., a worm drive 142, act as a passive lock which prevents movement of the lift device 110 unless a technician operates the controls 134 associated with the same. It is contemplated that the various examples of the one or more lock switches discussed above are not mutually exclusive and that the example lift devices disclosed herein may include any combination of the same to improve overall safety of the example lift devices by incorporating redundant backup features.

The lift device 110 may also include a control unit (not shown), e.g., a controller or processor, in communication with the controls 134 and the actuator. In some examples, the lift device 110 includes additional sensors (not shown) including, but not limited to positional sensors to detect an orientation of the lift device 110, e.g., a gyro sensor. The additional sensors may also include accelerometers, temperature sensors, and optical sensors including, but not limited to, optical bridge sensors, fiber optic sensors, photoelectric sensors, and optical encoders, point sensor, distributed sensor, extrinsic sensor, intrinsic sensor, through beam sensor, diffuse reflective sensor, and retro-reflective sensor. The additional sensors are in communication with the control unit and supply data collected to the same. The controller may be programmed to prevent the lift device 110 from powering on in certain orientations, e.g., when the lift device 110 is in the detached state and substantially vertical to the ground surface. In some examples the controls 134 may include an auto-attach switch and/or an auto-detach switch, that when actuated, will communicate with the control unit, and the control unit will drive the actuator to automatically transition the lift device 110 from a detached state to an attached state or from a detached state to an attached state, respectively. In examples including the auto-attach and/or auto-detach switch, the controller may use data received from the sensors to determine when a transition is complete and prompt communication with the actuator to stop driving the output gears 160.

The controller may also be programed to automatically move the lift device to a specific location on or relative to a chassis. In some of these examples, the controller may be loaded with one or more specifications related to specific models of chassis. The specification may include predefined locations on or relative to the chassis with respect to areas where an information processing device may be housed. In other examples, the controller may be programmed to use information received from a sensor, e.g., an optical sensor, to locate a specific location on or relative to the chassis. For example, specific locations on a chassis and/or a vertical column may include a fiducial marker. The fiducial marker may be removably attached (e.g., a magnet or sticker) or integral with the chassis or the vertical column. As the lift device translates vertically along one or more vertical columns removably attached, or integral with, a chassis the optical sensor will communicate with the controller when a fiducial marker for a specific location is detected. The controller may then stop vertical translation of the example lift device and an information processing device may be installed into the specific location, extracted from the specific location, or serviced relative to the specific location. In some examples, after extraction of an information processing device is complete, the controller may be programmed to lower the example lift device to the ground surface or position the lift device at a predefined height so that a technician can comfortably service the extracted information processing device without bending or overextending themselves. In some implementations the sensor comprises a radio frequency identification (RFID) reader. In these examples the fiducial markers comprise removably attached RFID tag set at specific locations along the chassis or vertical column. Inclusion of a controller, one or more sensors, and fiducial markers allows for automation, at least partially, with respect to the installation, extraction, or servicing of information processing devices housed in a chassis.

In some examples including a controller, the lift device may include means for communication (not shown) including, but not limited to a transmitter, a receiver, or a transceiver. In other examples, the means for communication comprise one or more ports configured to receive one or more communication cables, e.g., high speed data transmission, ethernet, coaxial, networking, telephone, fiber optic, CAT 3, CAT 5, CAT 6, and CAT 6A cables. In still other examples, the means for communication comprises a port configured to receive a memory and/or a storage device, e.g., USB flash drives or external hard disk drives. The means for communication may facilitate installing or updating software, may allow for a separate control device (e.g., wireless remote or a remote removably attached via an umbilical cable), and/or may facilitate obtaining diagnostic data or to run diagnostic tests. It is contemplated that some example lift devices may include a wireless, attached, or removably attached remote to control and operate the lift devices. In some of these examples, the remote includes the controller rather than the body of the lift device. In some other examples, both the remote and the lift device have controllers respectively. The example means for communication described above are not mutually exclusive and it is contemplated that the example lift devices disclose herein may include one or a combination of the example means for communication. In some implementations, the example lift devices disclosed herein do not include any means for communication as described above.

In examples including a controller and a mechanical lock as described above, the controller may also be programmed to automatically engage the mechanical lock, when the lift device is powered on, should the lift device accelerate or have a velocity beyond predetermined thresholds. For example, were the lift device to slip from or prematurely detach from the one or more vertical columns, whether due to mechanical failure or application of an outside force, the controller processes data received from the accelerometer by comparing the data received to data tables comprising predetermined thresholds. Should the data received from the accelerometer fall outside the predetermined thresholds, the controller will signal/engage the mechanical lock to stop and/or prevent movement or detachment of the lift device from the one or more vertical columns.

As shown in FIG. 2, in some examples (optionally) the body 120 may comprise a handle 118 to assist in maneuvering or transporting the lift device 110. In other examples, the handle 118 may collapse to provide a reduced profile, i.e., a stowed arrangement as shown in FIGS. 6A-6C, and enable the example lift devices disclosed herein to occupy a smaller area when in operation, stowed for transport, or stowed for storage. The handle 118 may partially collapses onto itself, collapse partially or entirely into the body 120, or partially collapse both onto itself and into the body 120. The handle 118 may also provide a grip so that the example lift devices disclosed herein may be carried similar to a briefcase or piece of luggage. In some examples, the handle 118 is textured, e.g., ridges (not shown), or has a coating to increase a friction coefficient when gripped and reduce slippage. Although inclusion of a handle 118 is one configuration of the body 120, the body 120 and the components thereof are not limited to such a configuration.

Figure 3:
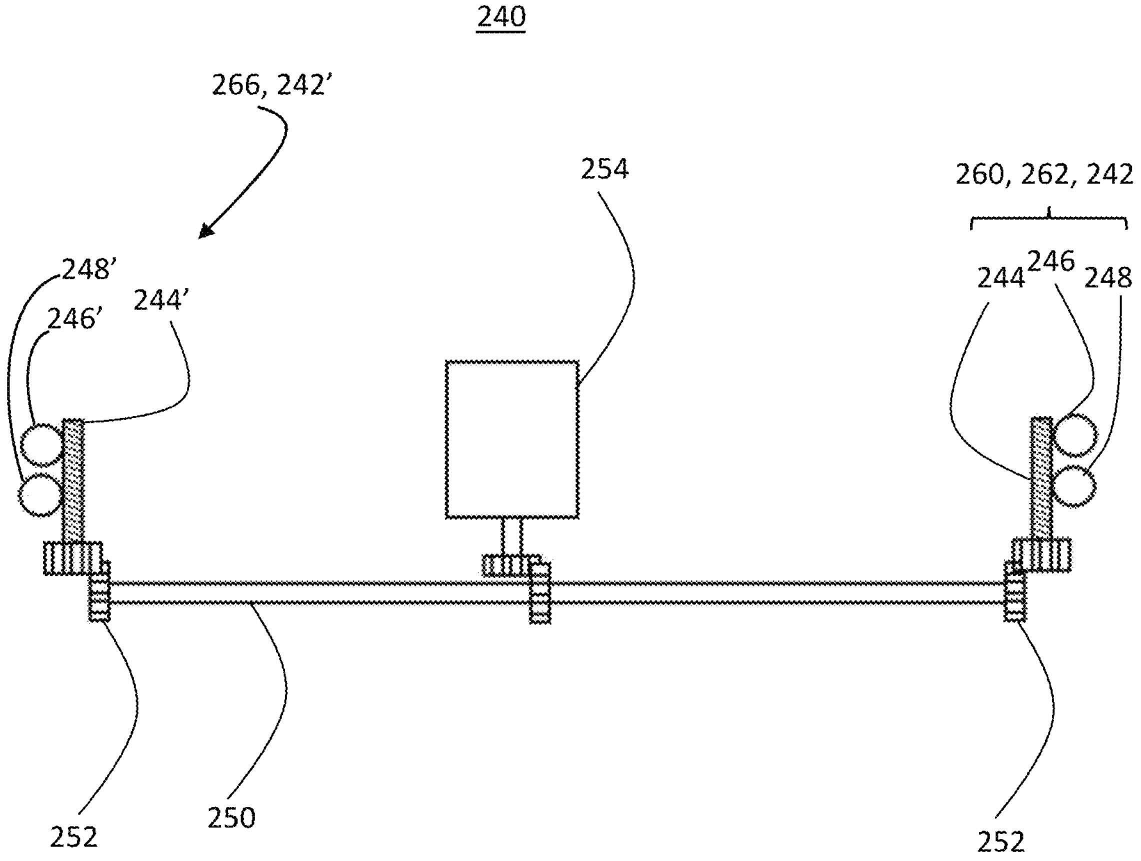
FIG. 3 is a top view of an example implementation of a drive unit of the example lift device illustrated in FIG. 2.

Turning now to FIG. 3, an example of a drive unit 240 is illustrated separate from the other portions of the example lift devices to more clearly depict and describe the features thereof. The drive unit 240 is one example implementation of the drive unit 40 described above. Moreover, although not visible in FIG. 2, in some examples the lift device 110 of FIG. 2 may utilize a drive unit corresponding to the drive unit 240.

The drive unit 240 includes the output gears 260 operably coupled to the body (not visible in FIG. 3), and an actuator 254 operably coupled to the output gears 260. During operation, the actuator 254 outputs force in a first direction or a second direction to drive rotation of the output gears 260 in one of two directions. In turn, the output gears 260 drive vertical translation, upward or downward, of the example lift devices disclosed herein. In some examples the drive unit 240 may include a drivetrain comprising one or more drive shafts, one or more outputs, one or more inputs, and one or more gear steps that operably couples the actuator 254 to the output gears 260 to transmit torque between the same. In some example implementations, the actuator 254 may comprise a first actuator and a second actuator (not shown), wherein the first actuator independently drives a first set of output gears 262 and the second actuator independently drives a second set of output gears 266.

In the illustrated example of FIG. 3, the actuator 254 comprises an electric motor that engages and transmits torque to a drive shaft 250. The drive shaft 250 engages and transmits torque to the output gears 260 of the drive unit 240. As illustrated, the output gears 260 comprise a first set of output gears 262 and a second set of output gears 266 spaced from and opposite the first set of output gears 262. In some examples, the first and second set of output gears 262 and 266 of the output gears 260 correspond to the first and second sets 162 and 166 of output gears 160 in the lift device 110. The drive shaft 250 engages and transmits torque to the first and second sets of output gears 262, 266 to drive vertical translation of the lift device 210. Also in this example, the first and second sets of output gears 262, 266 respectively comprise a first worm drive 242 and a second worm drive 242'. The first worm drive 242 includes a first worm screw 244 and at least a first worm wheel 246 engaged with the first worm screw 244. The second worm drive 242' includes a second worm screw 244' and at least a second worm wheel 246' engaged with the second worm screw 244'. The drive shaft 250 may comprise gears 252 which engage with the first and second worm screws 244 and 244' to transmit torque thereto. In this example, the electric motor drives rotation of the drive shaft 250, which drives rotation of the first and second worm screws 244 and 244', which operably drives rotation of the first worm wheel 246 and the second worm wheel 246'. The first and second worm drives 242 and 242' may also comprise additional worm wheels 248 and 248', which are driven in a similar manner as the first and second worm wheels 246 and 246'. When the lift device 210 is in, or transitioning to, an attached state, the first worm wheel 246 (and in some cases, the additional worm wheel 248) will engage a first vertical column of the one or more vertical columns 280 and the second worm wheel 246' (and in some cases, the additional worm wheel 248') will engage a second vertical column of the one or more vertical columns. When driven by the actuator 254, the first worm drive 242 and the second worm drive 242' will operate to drive vertical translation of the lift device 210 with respect to the first and second vertical columns.

It is contemplated that in some examples (not illustrated) the drive unit 240 may not include a drive shaft. In such an example, the actuator 254 may directly engage the output gears 260. In some examples, the actuator 254 comprises a first and second actuator (not shown), the first and second actuators may directly engage a first set of output gears 262 and a second set of output gears 266, respectively. In still other examples, one of the first and second actuators may directly engage one of a first and second set of output gears 262, 266 and the other of the first and second actuators may indirectly, e.g., via a drivetrain comprising at least a drive-shaft, engage the other of the first and second set of output gears 262, 266.

Figure 4A:
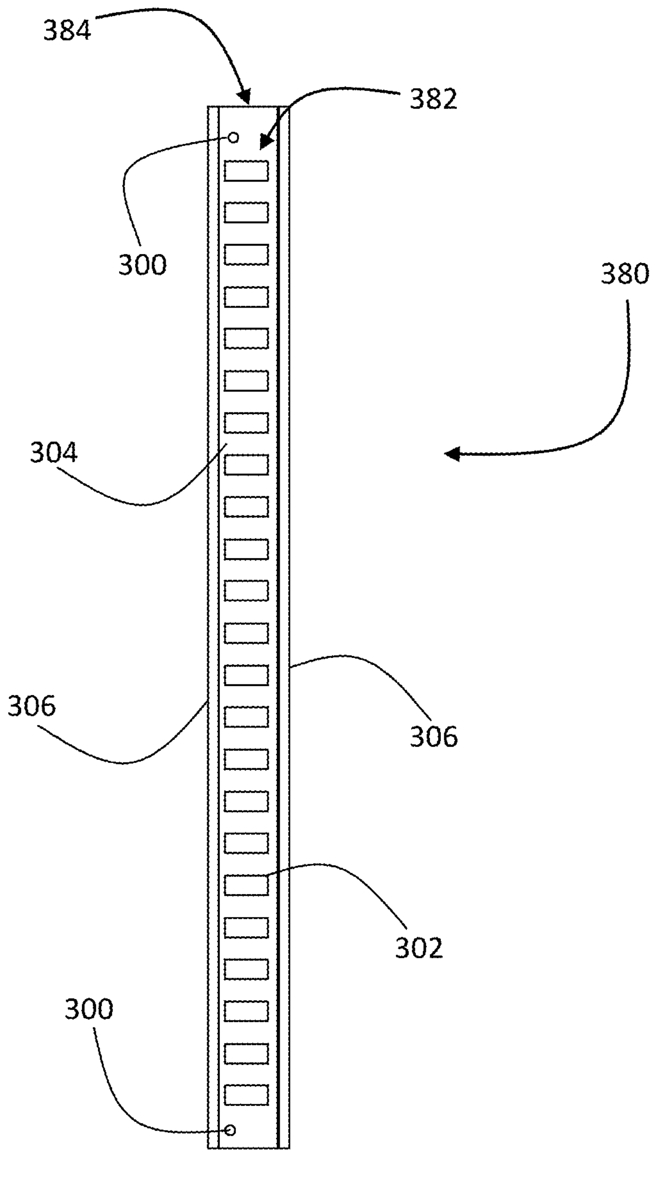
FIG. 4A is a front view of an example implementation of a vertical column.
Figure 4B:
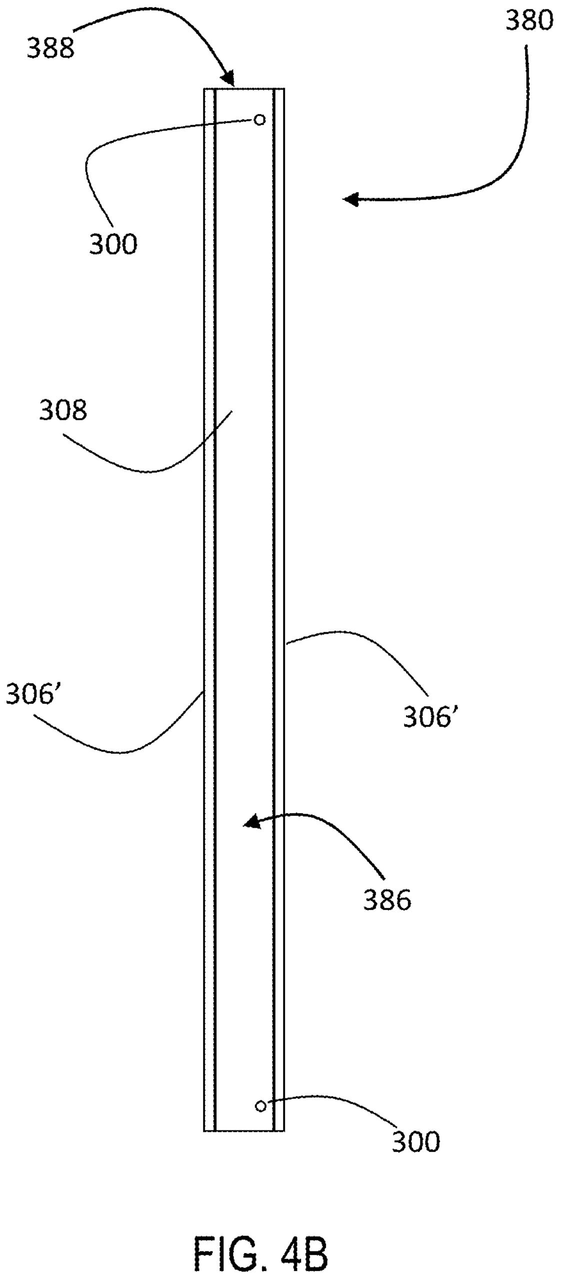
FIG. 4B is a rear view of the example vertical column illustrated in FIG. 4A.

Example implementations of a vertical column 380 is illustrated in FIGS. 4A-4B. The vertical column 380 includes a first side 384 and a second side 388 spaced from and opposite the first side 384. In some examples, the vertical columns 380 is integral with a chassis. In other examples, the vertical column 380 is configured to removably attach to a chassis via attachment means 300. In some of these examples, the vertical column 380 is configured to collapse from a first length to a second length less than the first length when detached and separate from a chassis. The attachment means 300 may comprise a connection point and/or extension configured to mate with a different connection point on a chassis; fasteners including, but not limited to, screws, bolts, U-bolts, clips, ties, rivets, and threaded rods; and one or more recesses configured to receive a fastener.

The first side 384 of the vertical column 380 includes a linear gear 382 configured to engage an output gear (not shown) of the one or more output gears of a lift device. In some implementations, the linear gear 382 comprises an engageable surface defining a plurality of features that an output gear engages with to drive vertical translation of the lift device. The plurality of features may comprise a plurality of ridges 302 that are perpendicular to and extend away from the first side 384. Each ridge of the plurality of ridges 302 are equally spaced from one another along a majority of the first side 384. In other implementations, the plurality of features comprises a plurality of cutouts (not shown) that extend either partially into the first side 384 or entirely through the vertical column 380 from the first side 384 to the second side 388. The plurality of cutouts are equally spaced from one another along a majority of the first side 384. In some examples, the first side 384 optionally defines a gear channel 304, e.g., a U-shaped recess, extending partially into the first side 384 and parallel to the longitudinal axis of the vertical column 380. In these examples the linear gear 382 is disposed within the gear channel 304 and the gear channel 304 is configured to receive at least a portion of an output gear. Side walls 306 defining the gear channel 304 may inhibit lateral translation of an output gear and therefore inhibit lateral translation of the example lift devices. In some examples, the gear channel 304 comprises an L-shaped recess (not shown), extending partially into the first side 384 and parallel to the longitudinal axis of the vertical column 380. In these examples, a side wall (not shown) defining a portion of the L-shaped recess is configured to inhibit lateral translation of an output gear in at least one direction and therefore prevent lateral translation, in at least one direction, of the example lift device. It is contemplated that the linear gear 382 may be formed integrally with the vertical column 380 or may be attached to the first side 384 of the vertical column 380, e.g., a track comprising a plurality of ridges.

As illustrated in FIG. 4B, the second side 388 of the vertical column 380 has a bearing surface 386 configured to engage and allow a bearing structure (not shown) of the one or more bearing structures to movably bear against the bearing surface 386 when a lift device is in an attached state. In some example implementations, the second side 388 is uniformly smooth with respect to the bearing surface 386. In other examples, the second side 388 optionally defines a bearing channel 308, e.g., a U-shaped recess, extending partially into the second side 388 and parallel to the longitudinal axis of the vertical column 380. In these examples, the bearing surface 386 defines a bottom of the bearing channel 308. The bearing channel 308 is configured to receive at least a portion of a bearing structure. Bearing side walls 306' defining the U-shaped recess may prevent lateral translation of a bearing structure and therefore prevent lateral translation of the example lift devices. In some examples, the bearing channel 308 comprises an L-shaped recess (not shown), extending partially into the second side 388 and parallel to the longitudinal axis of the vertical column 380. A side wall (not shown) defining a portion of the L-shaped recess is configured to prevent lateral translation of a bearing structure in at least one direction and therefore prevent the example lift devices from lateral translation in at least one direction.

It is contemplated that example implementations of the one or more vertical columns may include any combination of the features described above with respect to the first and second sides 384, 388 of the example vertical column 380 illustrated in FIGS. 4A-4B.

Figure 5:
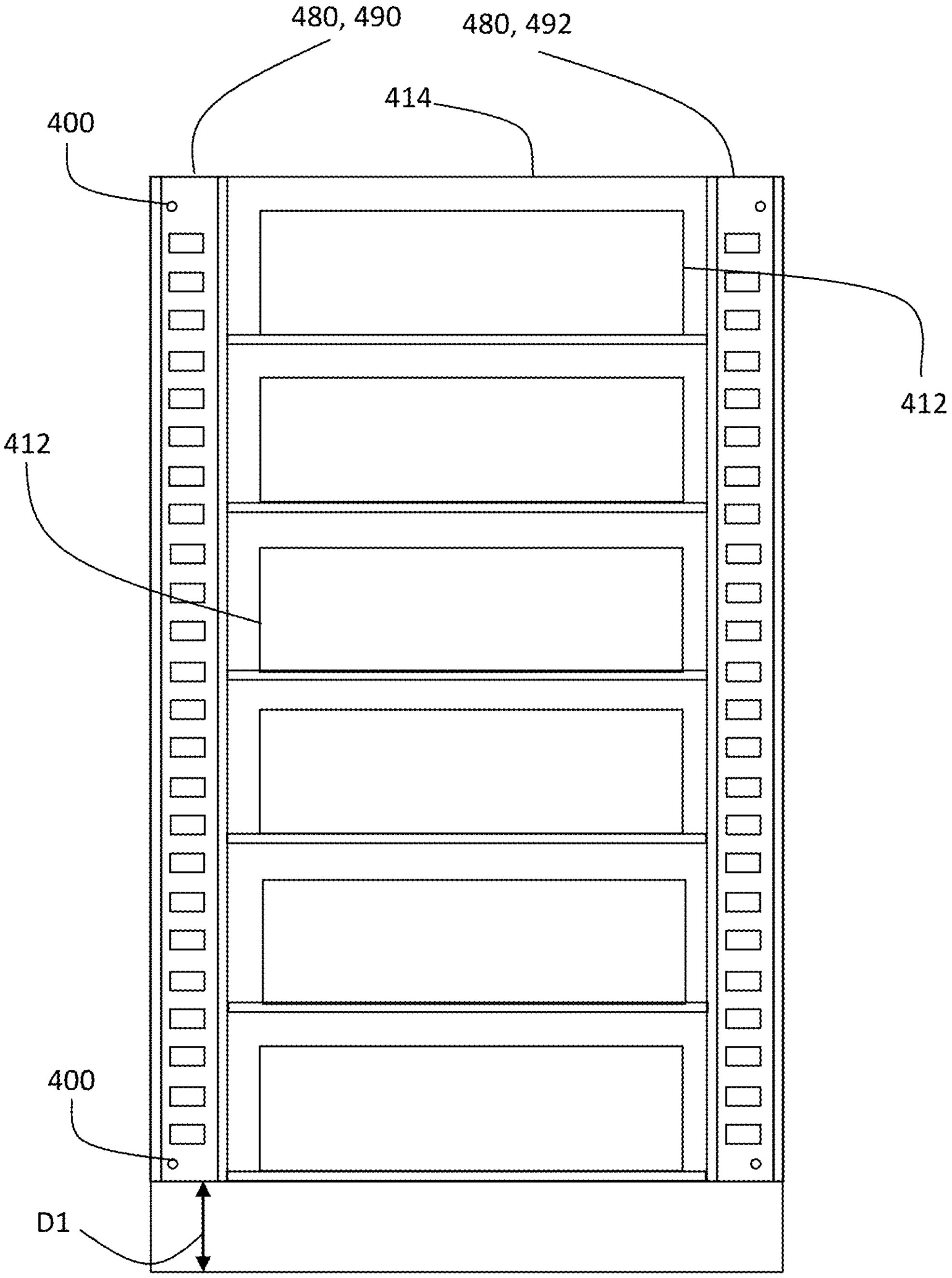
FIG. 5 is a front view of an example implementation of a chassis housing a plurality of information processing devices, the chassis comprising two example vertical columns.

In some example implementations, as illustrated in FIG. 5, the one or more vertical columns 480 are configured to removably attach, via attachment means 400, to a chassis 414 configured to house one or more information processing devices 412. As depicted, the one or more vertical columns 480 comprise a first vertical column 490 and a second vertical column 492. In some examples, the one or more vertical columns 480 and the chassis 414 are separated by a distance and define a space therebetween as illustrated in FIGS. 6A-6C. The space extends along a majority of the one or more vertical columns 480. The distance between the one or more vertical columns 480 and the chassis 414 is configured to allow one or more bearing structures to movably bear against a bearing surface without interference when a lift device, in an attached state, translates vertically. In other implementations, the one or more vertical columns 480 may be substantially flush with the chassis 414 and the chassis 414 may define one or more pockets of space running parallel to a majority of the one or more vertical columns 480. The one or more pockets of space allow one or more bearing structures movably bear against the bearing surface without interference when a lift device, in an attached state, translates vertically.

As illustrated in FIG. 5, the one or more vertical columns 480 are spaced a distance D1 from the ground surface upon which the chassis 414 rests. The distance D1 is greater than the size, e.g., height or diameter, of a bearing structure to allow a bearing structure to pass underneath the one or more vertical columns 480.

Turning now to FIGS. 6A-6C, an example implementation of a method for installation or removal of an information processing device 512 from a chassis 514 configured to house multiple information processing devices will now be described. When viewed in sequential order, FIGS. 6A-6C illustrate attachment of an example lift device 510 to one or more vertical columns 580. When viewed in reverse sequential order, FIGS. 6A-6C, illustrate detachment of an example lift device 510 from one or more vertical columns 580.

The method includes providing a lift device 510. The lift device 510 may comprise a body 520, a drive unit 540 comprising an actuator (not shown) and one or more output gears 560 operably coupled to the body 520, the actuator operably coupled to drive rotation of the output gears 560; and one or more bearing structures 570 attached to the body 520 adjacent the output gears 560. The body 520 may have a bottom surface 522 adjacent to the bearing structures 570; a top surface 524 spaced from and opposite the bottom surface 522; a support surface 526 extending between the bottom surface 522 and the top surface 524; and a rear surface 528 spaced from and opposite the support surface 526 and extending between the bottom surface 522 and the top surface 524. The body 520 may include a first side surface 530 and a second side surface (not shown) spaced from and opposite the first side surface 530, wherein each of the first side surface 530 and the second side surface respectively extend from the support surface 526 to the rear surface 528. The body 520 includes a power source 556 on the rear surface 528, controls (not shown) on the top surface 524, and optionally a handle 518 coupled to the top surface 524.

As illustrated in FIG. 6A, the lift device 510, in a detached stated, is transported adjacent one or more vertical columns 580 integral with, or removably attached to, a chassis 514. The one or more vertical columns 580 may each comprise a linear gear 582 on a first side 584 of the vertical column and a bearing surface 586 on a second side 588 of the vertical column. In the detached stated, the support surface 526 is disposed in a first orientation that is substantially vertical and substantially parallel to a vertical axis of the one or more vertical columns 580. In some examples, the lift device 510 remains in a vertical orientation relative to the one or more vertical columns 580 as illustrated in FIG. 6A.

Once the lift device 510 is transported to a position adjacent the chassis 514, the lift device 510 is attached to the one or more vertical columns 580 by engaging the output gears 560 with the linear gear 582 of the one or more vertical columns 580. As illustrated, the output gears 560 comprise a worm drive including a worm screw 544 and a worm wheel 546. Attaching the lift device 510, may include passing the bearing structures 570 under the one or more vertical columns 580 to rest proximate to, or in contact with, the bearing surface 586 of the second side 88. FIG. 6B illustrates the transition from the detached state to the attached stated. From the detached state, the support surface 526 will transition from a first orientation that is substantially vertical and substantially parallel to a vertical axis of the one or more vertical columns 580 and/or chassis 514 to a second orientation when the lift device 510 is attached to the one or more vertical columns 580. In the second orientation, the support surface 526 is substantially horizontal and substantially perpendicular to the vertical axis of the one or more vertical columns 580 and/or the chassis 514 as illustrated in FIG. 6C. While transitioning from the first orientation to the second orientation, the support surface 526 will define an ever-increasing acute angle, e.g., 1° increasing to 45° and from 45° increasing to 89°, relative to the vertical axis of the chassis 514 until the second orientation is achieved, e.g., 90° relative to the vertical axis of the one or more vertical columns 580 and/or the chassis 514. Likewise, the lift device 510 also transitions from a vertical orientation to a horizontal orientation relative to the vertical axis of the one or more vertical columns 580.

In some example implementations, the attaching may include removably attaching the one or more vertical columns 580 to the chassis 514 prior to attaching the lift device 510 to the one or more vertical columns 580.

In other examples, attaching the lift device 510 includes manually tilting and/or rotating the lift device 510 relative to the chassis 514 so that the bearing structures 570 pass underneath the one or more vertical columns 580 and become positioned proximate to, or in contact with, the bearing surface 586 on the second side 588 of the one or more vertical columns 580. In this example, the output gears 560 are contemporaneously engaged with the linear gear 582 on the first side 584 of the one or more vertical columns 580. Once tilted or rotated, the controls 534 are actuated to activate the actuator 554 and drive the output gears 560 engaged with the linear gear 582. Driving the output gears 560 will automatically complete the transition from the detached state to the attached state.

In other example implementations, attaching the lift devices does not including manually tilting and/or rotating the lift device 510. In these examples, the controls 534 are actuated to activate the actuator 554 and drive the output gears 560 engaged with the linear gear 582. Driving the output gears 560 will automatically tilt and/or rotate the lift device 510 relative to the vertical axis of the one or more vertical columns 580 and/or chassis 514 and until the transition from the detached state to the attached state is complete.

In each example of the attaching described above, as the lift device 510 is manually or automatically tiled and/or rotated, the bearing structures 570 pass underneath the one or more vertical columns 580 and come to rest proximate to, or in contact with, the bearing surface 586 of the second side 588 of the one or more vertical columns 580. Stated differently, in each example of the attaching described above, the bearing structures 570 pass underneath the one or more vertical columns 580 to rest between the one or more vertical columns 580 and the chassis 514.

The attached stated of the lift device 510 is illustrated in FIG. 6C. In the attached stated, the output gears 560 are securely engaged with the linear gear 582 of the first side 584 of the one or more vertical columns 580. When driven, the output gears 560 may continually engage and travel along the linear gear 582 of the one or more vertical columns 580. Still in reference to the attached stated, the bearing structures 570 bear against the bearing surface 586 of the second side 588 of the one or more vertical columns 580. When the output gears 560 are driven, the bearing structures travel along the bearing surface 586. In the attached state, and as illustrated in FIG. 6C, the one or more vertical columns 580 are positioned between the output gears 560 and the bearing structures 570. The arrangement of the output gears 560 to the bearing structures 570 allows for this configuration which provides excellent stability.

In the attached state, the force of gravity acts upon the lift device 510, the output gears 560 are biased in a first direction toward the first side 584 of the one or more vertical columns 580. Concurrently, the bearing structures 570 are biased in a second direction towards the second side 588 of the one or more vertical columns 580 and opposite the first direction. The biasing applies a first force in the first direction and a second force in the second direction to create a robust and resilient attachment between the lift device 510 and the one or more vertical columns 580. The one or more vertical columns 580 thereby support the lift device 510 via the output gears 560 and the bearing structures 570. Because the one or more vertical columns 580 are removably attached or integral with the chassis 514, the total weight of the chassis 514 and information processing devices 512 housed therein offset the total weight of the lift device 510 and any load disposed thereon. Stated differently, the total weight of the chassis 514 effectively acts as ballast to stabilize and offset the total weight of the lift device 510. Therefore, the examples lift devices 10, 210, 510 disclosed herein do not require independent ballast.

Once attached, the lift device 510 is vertically translated along the one or more vertical columns 580. Vertical translation includes actuating the controls 534 to communicate with the actuator 554 to drive the output gears 560 thereby driving vertical translation of the lift device 510. In some examples, the controls 534 may signal the actuator 554 to drive the output gears 560 in a first direction, e.g., clockwise, to translate the lift device 510 upward relative to the one or more vertical columns 580. The controls 534 may also signal the actuator 554 to drive the output gears 560 in a second direction, e.g., counter-clockwise, to translate the lift device 510 downward relative to the one or more vertical columns 580. In the attached state, and during any vertical translation, the one or more vertical columns 580 support the lift device 510 via the output gears 560 and the bearing structures 570.

Detaching the lift device 510 is similar to attaching the lift device 510, but in a reverse order of operation relative to the attaching. For example, the controls 534 on the lift device 510 may be actuated to vertically translate the lift device 510 downward. The bearing structures 570 will approach the bottom most surface of the one or more vertical columns 580 and then, due to the configuration of the output gears 560 relative to the bearing structures 570, pass under the one or more vertical columns 580. Contemporaneously with the bearing structures 570 beginning to pass under the one or more vertical columns 580, the lift device 510 will transition from the horizontal orientation of the attached state to the vertical orientation of the detached stated. Once the lift device 510 is in the vertical orientation of the attached state, the controls 534 may be released. In the detached stated, the lift device 510 may be maneuvered and/or transported.

In some example implementations, the detaching may include removing the one or more vertical columns 580 from the chassis 514 after detaching the lift device 510 from the one or more vertical columns 580.

In some examples, the method includes providing a given information processing device 612; loading the given information processing device 612 onto the lift device 510 wherein the lift device 510 is at a first vertical position, in the attached state. The method may also include translating the lift device 510 vertically from the first vertical position to a second vertical position corresponding to an installation location for the given information processing device 612 in the chassis 514, the second vertical position being above, or higher than, the first vertical position relative to the vertical axis of the one or more vertical columns 580 and/or the chassis 514. Further, the method may include installing the given information processing device 612 into the installation location in the chassis 514 by horizontally translating the information processing device 612 off of the lift device 510.

In other example implementations, the method includes translating the lift device 510 vertically to a third vertical position corresponding to an installation position at which a given information processing device 612 is installed in the chassis 514; removing the given information processing device 612 from the chassis 514 and horizontally translating the given information processing device 612 onto the lift device 510; translating the lift device 510 vertically to a first vertical position that is below, or lower than, the third vertical position relative to the vertical axis of the one or more vertical columns 580 and/or the chassis 514; and unloading the given information processing device 612 from the lift device 510.

The example lift devices 10, 110, 510 as disclosed herein may be included as part of a system. In one example, a system for lifting an information processing device relative to a chassis is provided. The system may comprise an example lift device 10, 110, 510 as disclosed herein and one or more vertical columns 80, 380, 480, 580 as disclosed herein. The one or more vertical columns 80, 380, 480, 580 are configured to removably attach to a chassis 14, 414.

In other implementations, the example lift devices 10, 110, 510 as disclosed herein may be included as part of a chassis system similar to what is shown in FIG. 5. The chassis system may comprise a chassis 14, 414 configured to receive a plurality of information processing devices 412 in a vertical or horizontal stacked arrangement. The chassis 14, 414 may optionally comprise a rack (e.g., a server rack) or a cabinet. The chassis system further comprises the example lift devices 10, 110, 510 disclosed herein and the one or more vertical columns 80. 380, 480, 580 disclosed herein. Wherein the one or more vertical columns 80, 380, 480, 580 may be integral with or removably attached to the chassis 14, 414.

The example implementations of the lift devices 10, 110, 510 disclosed herein have a significantly reduced size and overall footprint relative to traditional mechanical lifts. In those examples including a handle 18, 118, 518, the lift device 10, 110, 510 may further define a stowed size and a rolling size different from the stowed size. The stowed size refers to a transport or storage configuration having reduced overall dimensions relative to the rolling size which refers to a maneuver configuration, e.g., collapsing the handle 18, 118, 518. In some examples, the lift devices 10, 110, 510 disclosed herein have a stowed size of approximately 16 inches to 32 inches wide by 9 inches to 14 inches deep by 30 inches to 40 inches tall. In some examples, the lift devices 10, 110, 510 disclosed herein have a rolling size of approximately 16 inches to 32 inches wide by 9 inches to 14 inches deep by 40 inches to 50 inches tall. In one example, the lift device 10, 110, 510 has a stowed size of approximately 29 inches wide by 11 inches deep by 37 inches tall and a rolling size of 29 inches wide×11 inches deep×46 inches tall, dimensions which are similar to or approximately the size of a typical rolling suitcase having a collapsible handle in a collapsed and extended configuration, respectively. It is contemplated that the specific dimensions of the lift device can be modified based upon a specific model of chassis the lift device will be removably attached to as well as a specific model of an information processing device housed within that model of chassis. However, it is also contemplated that an example lift device having a specific set of dimensions can be removably attached to a plurality of different chassis, each having different dimensions. For example, uniform location and/or spacing of the one or more vertical rails on a plurality of different chassis allow a single lift device to removably attach to each of the plurality of different chassis regardless of the specific dimensions of the different chassis.

In addition to reduced size and footprint, the example implementations of the lift devices 10, 110 disclosed herein have a significantly reduced weight relative to traditional mechanical lifts. In some examples, the lift devices 10, 110, 510 weigh between 40 pounds to 100 pounds. In other examples, the lift devices 10, 110, 510 weigh between 50 pounds to 60 pounds.

The example implementations of the lift devices 10, 110, 510 disclosed herein can support a load (e.g., one or more information processing devices) up to and including 200 pounds when in an attached state. In some examples, the lift devices 10, 110, 510 can support an individual information processing device having a weight of 200 pounds or less. In other examples, the lift devices 10, 110, 510 can simultaneously support a plurality of information processing devices having a total weight of 200 pounds or less.

It is contemplated that the total weight of a lift device and any information processing devices disposed thereon cannot equal or exceed the total weight of the chassis and any information processing devices housed therein. In some examples, the total weight of a lift device and any information processing devices disposed thereon does not exceed 300 pounds. In some examples, the total weight of a lift device and any information processing devices disposed thereon does not exceed 260 pounds. In other examples, the total weight of a lift device and any information processing devices disposed thereon does not exceed 250 pounds.

Given the reduced size and weight the lift devices 10, 110, 510 disclosed herein, relative to traditional mechanical lifts, a single technician may easily attach, operate, and detach the lifts devices 10, 110, 510. Further, the lift devices 10, 110, 510 disclosed herein may be transported or maneuvered by a single technician. Accordingly, the lift devices 10, 110, 510 disclosed herein may alleviate existing OSHA regulations related to the same.

The reduced size and weight of the example implementations of the lift devices disclosed herein are a significant improvement relative to traditional mechanical lifts. For example, the lift devices disclosed herein have significantly increased portability and maneuverability. The lift devices disclosed herein are configured for inexpensive and easy transport, as compared to traditional mechanical lifts, between different locations or countries. In some examples, the lift devices disclosed herein be carried like a typical suitcase by a single individual. In some examples, the lift device may be rolled like a typical suitcase that includes wheels and a handle. In still other examples, the lift device has dimensions and weight similar or proximate to typical carry-on luggage requirements as currently defined by existing airlines. In yet other examples, the lift device has dimensions and weight similar or proximate to typical checked luggage requirements as currently defined by existing airlines. Stated differently, the lift devices disclosed herein may be transported similar to a typical piece of luggage, via automobile or airplane, and therefore do not require additional, or special, accommodations beyond those already in place with respect to transporting luggage. In a similar vein, the example lift devices disclosed herein require significantly less storage space given the reduced size relative to traditional mechanical lifts.

Other practical advantages attributable to the reduced size and weight of the lift devices disclosed herein, is that the lift devices can be easily carried over, or maneuvered around, other objects in crowded spaces, e.g., such as a single row of server racks or a single isle between adjacent rows of server racks found in tightly packed server rooms. Moreover, the lift devices disclosed herein can be easily maneuvered around other individuals and/or additional example lift devices to facilitate simultaneous work on a single server rack or multiple server racks in a single row. The improved maneuverability of the example lift devices reduces the likelihood of damaging walls, sprinkler systems, and racks, chassis, or cabinets housing information processing devices, or the information processing devices housed in the racks, chassis, and cabinets.

In the description above, various types of electronic circuitry or devices are described. As used herein, "electronic" is intended to be understood broadly to include all types of circuitry/devices utilizing electricity, including digital and analog circuitry, direct current (DC) and alternating current (AC) circuitry, and circuitry/devices for converting electricity into another form of energy and circuitry/devices for using electricity to perform other functions. In other words, as used herein there is no distinction between "electronic" circuitry/devices and "electrical" circuitry/devices. In some cases, certain electronic circuitry/devices may comprise processing circuitry. Processing circuitry comprises circuitry configured with logic for performing various operations. The logic of the processing circuitry may comprise dedicated hardware to perform various operations, software (machine readable and/or processor executable instructions) to perform various operations, or any combination thereof. In implementations in which the logic comprises software, the processing circuitry may include a processor to execute the software instructions and a memory device that stores the software. The processor may comprise one or more processing devices capable of executing machine readable instructions, such as, for example, a processor, a processor core, a central processing unit (CPU), a controller, a microcontroller, a system-on-chip (SoC), a digital signal processor (DSP), a graphics processing unit (GPU), etc. In cases in which the processing circuitry includes dedicated hardware, in addition to or in lieu of the processor, the dedicated hardware may include any information processing device that is configured to perform specific operations, such as an Application Specific Integrated Circuit (ASIC), a Field Programmable Gate Array (FPGA), a Complex Programmable Logic Device (CPLD), discrete logic circuits, a hardware accelerator, a hardware encoder, etc. The processing circuitry may also include any combination of dedicated hardware and processor plus software.

It is to be understood that both the general description and the detailed description provide example implementations that are explanatory in nature and are intended to provide an understanding of the present disclosure without limiting the scope of the present disclosure. Other examples in accordance with the present disclosure will be apparent to those skilled in the art based on consideration of the disclosure herein. For example, various mechanical, compositional, structural, electronic, and operational changes may be made to the disclosed examples without departing from the scope of this disclosure, including for example the addition, removal, alteration, substitution, or rearrangement of elements of the disclosed examples, as would be apparent to one skilled in the art in consideration of the present disclosure. Moreover, it will be apparent to those skilled in the art that certain features or aspects of the present teachings may be utilized independently (even if they are disclosed together in some examples) or may be utilized together (even if disclosed in separate examples), whenever practical. In some instances, well-known circuits, structures, and techniques have not been shown or described in detail in order not to obscure the examples. Thus, the following claims are intended to be given their fullest breadth, including equivalents, under the applicable law, without being limited to the examples disclosed herein.

References herein to examples, implementations, or other similar references should be understood as referring to prophetic or hypothetical examples, rather than to devices/systems that have been actually produced, unless explicitly indicated otherwise. Similarly, references to qualities or characteristics of examples should be understood as representing the educated estimates or expectations of the inventors based on their understanding of the relevant principles involved, application of theory and/or modeling, and/or past experiences, rather than as being representations of the actual qualities or characteristics of an actually produced device/system or the empirical results of tests actually carried out, unless explicitly indicated otherwise.

Further, spatial, positional, and relational terminology used herein is chosen to aid the reader in understanding examples of the invention but is not intended to limit the invention to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Furthermore, if a different reference frame is considered than the one illustrated in the figures, then the spatial terms used herein may need to be interpreted differently in that different reference frame. Moreover, the poses of items illustrated in the figure are chosen for convenience of illustration and description, but in an implementation in practice the items may be posed differently.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition. Moreover, unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within +1% of the stated value, property, or relationship unless indicated otherwise.

What is claimed is:

1. A lift device for lifting an information processing device relative to a chassis, comprising:

a body;

a drive unit comprising an actuator and one or more output gears operably coupled to the body, the actuator operably coupled to drive rotation of the one or more output gears; and one or more bearing structures attached to the body adjacent the one or more output gears;

wherein the lift device has an attached state in which the lift device is removably attached to and translatable vertically along one or more vertical columns that are integral with or removably attached to the chassis and a detached state in which the lift device is detached from the one or more vertical columns, wherein in the attached state, each of the one or more output gears is engaged with a linear gear of one of the vertical columns and each of the bearing structures movably bears against one of the vertical columns, such that:

the one or more vertical columns support the lift device via the one or more output gears and the one or more bearing structures; and rotation of the one or more output gears drives vertical translation of the lift device relative to the chassis, and wherein the one or more bearing structures are positioned on the body to bear against a ground surface to support movement of the lift device about the ground surface in the detached state and to movably bear against the one or more vertical columns to support the lift device in the attached state.

2. The lift device of claim 1, the body comprising:

a bottom surface adjacent to the one or more bearing structures;

a top surface spaced from and opposite the bottom surface;

a support surface extending between the bottom surface and the top surface; and a rear surface spaced from and opposite the support surface and extending between the bottom surface and the top surface;

wherein the support surface is vertical and parallel to a vertical axis of the chassis in the detached state and is horizontal and perpendicular to the vertical axis in the attached state; and wherein the support surface is configured to receive and support one or more information processing devices for installation into the chassis or removal from the chassis when the lift device is in the attached state.

3. The lift device of claim 1, the drive unit comprising a worm drive including a worm screw operably coupled to the actuator and a worm wheel engaged with the worm screw, the worm wheel being one of the one or more output gears.

4. The lift device of claim 1, wherein the actuator comprises an electrically powered actuator and the lift device further comprises a power source to power the electrically powered actuator.

5. The lift device of claim 4, the power source comprising a rechargeable battery that is removably attached to the lift device.

6. The lift device of claim 1, wherein the one or more bearing structures comprise wheels, rollers, and/or skids.

7. The lift device of claim 1, wherein each of the one or more vertical columns comprises:

a linear gear on a first side of the vertical column to engage with the one or more output gears in the attached state, and a bearing surface on a second side of the vertical column to engage with the one or more bearing structures in the attached state, the first side spaced from and opposite the second side.

8. The lift device of claim 7, the one or more vertical columns comprising a first vertical column and a second vertical column; the one or more output gears comprising a first group of output gears spaced from and opposite a second group of output gears; and the one or more bearing structures comprising a first group of bearing structures spaced from and opposite a second group of bearing structures;

wherein the first group of bearing structures is adjacent the first group of output gears and the second group of bearing structures is adjacent the second group of output gears;

wherein the first group of output gears and the first group of bearing structures respectively engage the linear gear and the bearing surface of the first vertical column in the attached state; and wherein the second group of output gears and the second group of bearing structures respectively engage the linear gear and the bearing surface of the second vertical column in the attached state.

9. A system for lifting an information processing device relative to a chassis, comprising:

the lift device of claim 1; and the one or more vertical columns, wherein the one or more vertical columns are configured to be removably attached to the chassis.

10. The system of claim 9, wherein the one or more vertical columns are collapsible.

11. A chassis system, comprising:

the chassis, the chassis configured to receive a plurality of information processing devices in a vertically stacked arrangement; and the one or more vertical columns that are integral with or removably attached to the chassis the lift device of claim 1.

12. The chassis system of claim 11, wherein the one or more vertical columns are integral with the chassis.

13. The chassis system of claim 11, wherein the one or more vertical columns are removably attached to the chassis.

14. A method for installation or removal of an information processing device from a chassis configured to house multiple information processing devices, the method comprising:

providing a lift device comprising a body, a drive unit comprising an actuator and one or more output gears operably coupled to the body, the actuator operably coupled to drive rotation of the one or more output gears; and one or more bearing structures attached to the body adjacent the one or more output gears;

transporting the lift device to a position adjacent a chassis with one or more vertical columns that are part of or removably attached to the chassis, each of the one or more vertical columns comprising a linear gear on a first side of the vertical column and a bearing surface on a second side of the vertical column;

attaching the lift device to the one or more vertical columns by engaging each of the one or more output gears with the one or more linear gears of the one or more vertical columns and positioning each of the one or more bearing structures to movably bear against the bearing surface of the one or more vertical columns, wherein the attaching comprises:

rotating the lift device from a first orientation to a transitioning orientation different from the first orientation to cause engagement of a first output gear of the one or more output gears with a first linear gear of a first vertical column of the one or more vertical columns;

moving a first bearing structure of the one or more bearing structures at least partially under the first vertical column from the first side toward the second side; and driving the one or more output gears to rotate the lift device from the transitioning orientation to a second orientation different from each of the first and transitioning orientations to cause the first bearing structure to move under the first vertical column and engage a first bearing surface of the first vertical column;

translating the lift device vertically along the one or more vertical columns by driving rotation of the one or more output gears, wherein during the translation the one or more vertical columns support the lift device via the one or more output gears and bearing structures; and detaching the lift device from the chassis.

15. The method of claim 14, further comprising:

prior to attaching the lift device to the one or more vertical columns, removably attaching the one or more vertical columns to the chassis.

16. The method of claim 14, wherein the one or more vertical columns are integral with the chassis.

17. The method of claim 14, the body comprising:

a bottom surface adjacent to the one or more bearing structures;

a top surface spaced from and opposite the bottom surface;

a support surface extending between the bottom surface and the top surface; and a rear surface spaced from and opposite the support surface and extending between the bottom surface and the top surface;

wherein the support surface is vertical and parallel to a vertical axis of the chassis in the first orientation;

wherein the support surface defines an acute angle with the vertical axis of the chassis in the transitioning orientation; and wherein the support surface is horizontal and perpendicular to the vertical axis of the chassis in the second orientation.

18. The method of claim 14, comprising:

providing a given information processing device;

loading the given information processing device onto the lift device in a first position;

translating the lift device vertically to a second position corresponding to an installation location for the given information processing device in the chassis, the second position being higher than the first position; and installing the given information processing device into the installation location in the chassis by horizontally translating the information processing device off the lift device.

19. The method of claim 14, comprising:

translating the lift device vertically to a third position corresponding to an installation position at which a given information processing device is installed in the chassis;

removing the given information processing device from the chassis and horizontally translating the given information processing device onto the lift device;

translating the lift device vertically to a first position that is lower than the third position; and unloading the given information processing device from the lift device.

* * * * *